US010573499B2

(12) United States Patent
Chambers et al.

(10) Patent No.: US 10,573,499 B2
(45) Date of Patent: Feb. 25, 2020

(54) METHOD OF EXTRACTING AND ACCELERATING IONS

(71) Applicants: AGC Flat Glass North America, Inc., Alpharetta, GA (US); Asahi Glass Co., Ltd., Tokyo (JP); AGC Glass Europe S.A., Gosselies (BE)

(72) Inventors: John Chambers, San Francisco, CA (US); Peter Maschwitz, Sebastopol, CA (US)

(73) Assignees: AGC FLAT GLASS NORTH AMERICA, INC., Alpharetta, GA (US); ASAHI GLASS CO., LTD., Tokyo (JP); AGC GLASS EUROPE, Louvain-la Neuve (BE)

( * ) Notice: Subject to any disclaimer, the term of this patent is extended or adjusted under 35 U.S.C. 154(b) by 0 days.

(21) Appl. No.: 14/975,415

(22) Filed: Dec. 18, 2015

(65) Prior Publication Data
US 2017/0178870 A1   Jun. 22, 2017

(51) Int. Cl.
*H01J 37/08* (2006.01)
*H01J 37/32* (2006.01)
*H01J 27/08* (2006.01)

(52) U.S. Cl.
CPC ........ *H01J 37/32623* (2013.01); *H01J 27/08* (2013.01); *H01J 37/08* (2013.01);
(Continued)

(58) Field of Classification Search
CPC ........... H01J 37/32541; H01J 37/32596; H01J 37/32568; H01J 37/32651
(Continued)

(56) References Cited

U.S. PATENT DOCUMENTS 2,920,235 A   1/1960  Bell et al.
3,253,180 A   5/1966  Huber
(Continued)

FOREIGN PATENT DOCUMENTS

CN   1598049 A   3/2005
CN   1831190 A   9/2006
(Continued)

OTHER PUBLICATIONS

Non-final Office Action, issued in U.S. Appl. No. 14/942,737, dated Sep. 22, 2016, 53 pages.
(Continued)

*Primary Examiner* — Christopher M Raabe
(74) *Attorney, Agent, or Firm* — Rothwell, Figg, Ernst & Manbeck, P.C.

(57) ABSTRACT

A method of extracting and accelerating ions is provided. The method includes providing a ion source. The ion source includes a chamber. The ion source further includes a first hollow cathode having a first hollow cathode cavity and a first plasma exit orifice and a second hollow cathode having a second hollow cathode cavity and a second plasma exit orifice, the first and second hollow cathodes being disposed adjacently in the chamber. The ion source further includes a first ion accelerator between and in communication with the first plasma exit orifice and the chamber. The first ion accelerator forms a first ion acceleration cavity. The ion source further includes a second ion accelerator between and in communication with the second plasma orifice and the chamber. The second ion accelerator forms a second ion acceleration cavity. The method further includes generating a plasma using the first hollow cathode and the second hollow cathode. The first hollow cathode and the second hollow cathode are configured to alternatively function as electrode and counter-electrode. The method further
(Continued)

includes extracting and accelerating ions. Each of the first ion acceleration cavity and the second ion acceleration cavity are sufficient to enable the extraction and acceleration of ions.

44 Claims, 14 Drawing Sheets

(52) U.S. Cl.
  CPC .. *H01J 37/32055* (2013.01); *H01J 37/32596* (2013.01); *H01J 2237/004* (2013.01); *H01J 2237/022* (2013.01); *H01J 2237/316* (2013.01); *H01J 2237/3142* (2013.01); *H01J 2237/3151* (2013.01)

(58) Field of Classification Search
  USPC .................................................. 313/231.31
  See application file for complete search history.

(56) References Cited

U.S. PATENT DOCUMENTS

| | | | |
|---|---|---|---|
| 3,381,157 A | 4/1968 | Ferreira | |
| 3,813,549 A | 5/1974 | Di Stefano et al. | |
| 4,017,808 A | 4/1977 | Fein et al. | |
| 4,196,233 A | 4/1980 | Bitzer et al. | |
| 4,419,203 A | 12/1983 | Harper et al. | |
| 4,422,014 A | 12/1983 | Glaser | |
| 4,702,784 A | 10/1987 | Naoumidis et al. | |
| 4,916,356 A | 4/1990 | Ahern et al. | |
| 5,028,791 A | 7/1991 | Koshiishi et al. | |
| 5,070,811 A | 12/1991 | Feuerstein et al. | |
| 5,113,790 A | 5/1992 | Geisler et al. | |
| 5,185,132 A | 2/1993 | Horiike et al. | |
| 5,286,534 A | 2/1994 | Kohler et al. | |
| 5,302,422 A | 4/1994 | Nowak et al. | |
| 5,369,337 A | 11/1994 | Yanagi | |
| 5,399,254 A | 3/1995 | Geisler et al. | |
| 5,437,778 A * | 8/1995 | Hedgcoth | C23C 14/3407 204/192.12 |
| 5,581,155 A | 12/1996 | Morozov et al. | |
| 5,593,539 A | 1/1997 | Kubota et al. | |
| 5,609,690 A | 3/1997 | Watanabe et al. | |
| 5,614,248 A | 3/1997 | Schiller et al. | |
| 5,614,273 A | 3/1997 | Goedicke et al. | |
| 5,627,435 A | 5/1997 | Jansen et al. | |
| 5,846,608 A | 12/1998 | Neumann et al. | |
| 5,874,807 A | 2/1999 | Neger et al. | |
| 5,908,602 A | 6/1999 | Bardos et al. | |
| 5,939,829 A | 8/1999 | Schoenbach et al. | |
| 5,985,378 A | 11/1999 | Paquet | |
| 6,082,293 A | 7/2000 | Kawashima | |
| 6,140,773 A | 10/2000 | Anders et al. | |
| 6,146,462 A | 11/2000 | Yializis et al. | |
| 6,174,450 B1 | 1/2001 | Patrick et al. | |
| 6,177,148 B1 | 1/2001 | Walther et al. | |
| 6,293,222 B1 | 9/2001 | Paquet | |
| 6,388,381 B2 | 5/2002 | Anders | |
| 6,444,945 B1 | 9/2002 | Maschwitz et al. | |
| 6,489,854 B1 | 12/2002 | Chen | |
| 6,508,911 B1 | 1/2003 | Han et al. | |
| 6,528,947 B1 | 3/2003 | Chen et al. | |
| 6,750,600 B2 | 6/2004 | Kaufman | |
| 6,768,079 B2 | 7/2004 | Kosakai | |
| 6,800,336 B1 | 10/2004 | Förnsel et al. | |
| 6,849,854 B2 | 2/2005 | Sainty | |
| 6,899,054 B1 | 5/2005 | Bárdos et al. | |
| 6,902,814 B2 | 6/2005 | Takahashi et al. | |
| 6,924,223 B2 | 8/2005 | Yamasaki et al. | |
| 7,241,360 B2 | 7/2007 | Shabalin et al. | |
| 7,307,383 B2 | 12/2007 | Takeuchi et al. | |
| 7,322,313 B2 | 1/2008 | Mayumi et al. | |
| 7,327,089 B2 | 2/2008 | Madocks | |
| 7,411,352 B2 | 8/2008 | Madocks | |
| 7,411,353 B1 | 8/2008 | Rutberg et al. | |
| 7,543,546 B2 | 6/2009 | Shibata et al. | |
| 7,649,316 B2 | 1/2010 | Rueger et al. | |
| 7,976,907 B2 | 7/2011 | Hofrichter et al. | |
| 8,143,788 B2 | 3/2012 | Hofer et al. | |
| 8,328,982 B1 | 12/2012 | Babayan et al. | |
| 8,356,575 B2 | 1/2013 | Sasaki et al. | |
| 8,476,587 B2 | 7/2013 | Jones et al. | |
| 8,652,586 B2 | 2/2014 | Maschwitz | |
| 8,697,197 B2 | 4/2014 | Savas et al. | |
| 8,926,920 B2 | 1/2015 | Morfill et al. | |
| 9,533,914 B2 | 1/2017 | Mahieu et al. | |
| 9,704,692 B2 | 7/2017 | Leeser | |
| 9,721,765 B2 | 8/2017 | Chambers et al. | |
| 9,735,020 B2 | 8/2017 | Hudson | |
| 10,068,743 B2 | 9/2018 | Goerbing | |
| 2002/0000779 A1 | 1/2002 | Anders | |
| 2002/0194833 A1* | 12/2002 | Gallimore | F03H 1/0068 60/202 |
| 2003/0113479 A1 | 6/2003 | Fukuda et al. | |
| 2004/0033385 A1 | 2/2004 | Kaushal et al. | |
| 2005/0016456 A1 | 1/2005 | Taguchi et al. | |
| 2005/0016458 A1 | 1/2005 | Zhang et al. | |
| 2005/0035731 A1 | 2/2005 | Secheresse et al. | |
| 2005/0040037 A1 | 2/2005 | Walton et al. | |
| 2005/0106094 A1 | 5/2005 | Kondo | |
| 2005/0115933 A1 | 6/2005 | Kong et al. | |
| 2005/0208215 A1 | 9/2005 | Eguchi et al. | |
| 2005/0221022 A1 | 10/2005 | Wang et al. | |
| 2006/0030134 A1 | 2/2006 | Kim et al. | |
| 2006/0177599 A1* | 8/2006 | Madocks | C23C 14/32 427/569 |
| 2006/0208649 A1 | 9/2006 | Rueger et al. | |
| 2007/0002515 A1 | 1/2007 | Hino et al. | |
| 2007/0017636 A1 | 1/2007 | Goto et al. | |
| 2007/0123041 A1 | 5/2007 | Anzai et al. | |
| 2007/0144621 A1 | 6/2007 | Farmer et al. | |
| 2007/0163440 A1 | 7/2007 | Kim et al. | |
| 2008/0073557 A1 | 3/2008 | German et al. | |
| 2008/0106202 A1 | 5/2008 | Du et al. | |
| 2009/0004836 A1 | 1/2009 | Singh et al. | |
| 2009/0032393 A1 | 2/2009 | Madocks | |
| 2009/0071403 A1 | 3/2009 | Choi et al. | |
| 2009/0071406 A1 | 3/2009 | Choi et al. | |
| 2009/0183771 A1 | 7/2009 | Sunnomiya et al. | |
| 2009/0218212 A1 | 9/2009 | Denpoh et al. | |
| 2010/0028238 A1* | 2/2010 | Maschwitz | C23C 16/402 423/335 |
| 2010/0044579 A1 | 2/2010 | Holmes et al. | |
| 2010/0126779 A1 | 5/2010 | Corbett et al. | |
| 2010/0186671 A1 | 7/2010 | Hein et al. | |
| 2010/0225234 A1 | 9/2010 | Tseng et al. | |
| 2011/0005682 A1 | 1/2011 | Savas et al. | |
| 2011/0006040 A1* | 1/2011 | Savas | C23C 16/24 216/71 |
| 2011/0135843 A1 | 6/2011 | Niira et al. | |
| 2011/0192348 A1 | 8/2011 | Tseng et al. | |
| 2011/0212624 A1 | 9/2011 | Hudson | |
| 2011/0226611 A1 | 9/2011 | Madocks | |
| 2011/0297532 A1 | 12/2011 | Chakraborty et al. | |
| 2012/0164353 A1 | 6/2012 | Madocks | |
| 2012/0019946 A1 | 8/2012 | Rasheed et al. | |
| 2012/0225218 A1 | 9/2012 | Savas et al. | |
| 2012/0258555 A1 | 10/2012 | Holland et al. | |
| 2012/0289054 A1* | 11/2012 | Holland | H01J 37/32082 438/711 |
| 2012/0313517 A1 | 12/2012 | Rueger et al. | |
| 2013/0112670 A1 | 5/2013 | Yokogawa et al. | |
| 2013/0333618 A1 | 12/2013 | Cox | |
| 2013/0337657 A1 | 12/2013 | Savas et al. | |
| 2014/0099451 A1 | 4/2014 | Mahieu et al. | |
| 2014/0216343 A1 | 8/2014 | Maschwitz | |
| 2014/0220361 A1 | 8/2014 | Maschwitz | |
| 2014/0272388 A1 | 9/2014 | Knight et al. | |
| 2014/0272459 A1 | 9/2014 | Daugherty et al. | |
| 2014/0354119 A1 | 12/2014 | Shishido et al. | |
| 2014/0354149 A1 | 12/2014 | Morgner et al. | |
| 2015/0002021 A1 | 1/2015 | Maschwitz | |
| 2015/0004330 A1 | 1/2015 | Maschwitz | |

(56) References Cited

U.S. PATENT DOCUMENTS

| | | |
|---|---|---|
| 2015/0152542 A1 | 6/2015 | Deppisch et al. |
| 2015/0235814 A1 | 8/2015 | Kawahara et al. |
| 2016/0024657 A1 | 1/2016 | Sakamoto et al. |
| 2017/0004955 A1 | 1/2017 | Leeser |
| 2017/0040145 A1 | 2/2017 | Brandon et al. |
| 2017/0178869 A1 | 6/2017 | Chambers et al. |
| 2018/0025892 A1 | 1/2018 | Biquet et al. |

FOREIGN PATENT DOCUMENTS

| | | |
|---|---|---|
| CN | 1860587 A | 11/2006 |
| CN | 102099505 A | 6/2011 |
| CN | 102497721 A | 6/2012 |
| CN | 102677022 A | 9/2012 |
| CN | 102771192 A | 11/2012 |
| CN | 102816987 A | 12/2012 |
| CN | 103042317 A | 4/2013 |
| CN | 103493602 A | 1/2014 |
| CN | 103534383 A | 1/2014 |
| CN | 103632911 A | 3/2014 |
| CN | 105427014 A | 3/2016 |
| DE | 199 02 146 A1 | 8/2000 |
| EA | 201391765 A1 | 4/2014 |
| EP | 0727508 A1 | 8/1996 |
| EP | 0881865 A2 | 12/1998 |
| EP | 0886310 A2 | 12/1998 |
| EP | 1035561 A2 | 9/2000 |
| EP | 1913624 B1 | 10/2011 |
| GB | 1 257 015 | 12/1971 |
| JP | S-59228338 A | 12/1984 |
| JP | S61-238962 A | 10/1986 |
| JP | 61251021 A | 11/1986 |
| JP | S63-297560 A | 12/1988 |
| JP | H4-180557 A | 6/1992 |
| JP | H4-358076 A | 12/1992 |
| JP | H5-226258 A | 9/1993 |
| JP | H7-73994 A | 3/1995 |
| JP | H11-335868 A | 12/1999 |
| JP | 3061288 B2 | 4/2000 |
| JP | 2001035692 A | 2/2001 |
| JP | 2002-121670 A | 4/2002 |
| JP | 2002-143795 A | 5/2002 |
| JP | 2003-193239 A | 7/2003 |
| JP | 2004-533703 A | 11/2004 |
| JP | 2005-005065 A | 1/2005 |
| JP | 2005-5065 A | 1/2005 |
| JP | 2005-068444 A | 3/2005 |
| JP | 2005-68444 A | 3/2005 |
| JP | 2002-143795 A | 5/2005 |
| JP | 2005-243892 A | 9/2005 |
| JP | 2005-302681 A | 10/2005 |
| JP | 2006-164683 A | 6/2006 |
| JP | 2007-026781 A | 2/2007 |
| JP | 2007-280641 A | 10/2007 |
| JP | 2008-4814 A | 1/2008 |
| JP | 2008-112580 A | 5/2008 |
| JP | 2009-502554 A | 1/2009 |
| JP | 2009-534797 A | 9/2009 |
| JP | 2010-021140 A | 1/2010 |
| JP | 2010530115 A | 9/2010 |
| JP | 2011-530155 A | 12/2011 |
| JP | 2013-520836 A | 6/2013 |
| JP | 2013-0251367 A | 12/2013 |
| JP | 2014-518947 A | 8/2014 |
| KR | 2008-0024693 A | 3/2008 |
| KR | 10-1179650 B1 | 9/2012 |
| RU | 2239532 C1 | 11/2004 |
| TW | 200304343 A | 9/2003 |
| TW | I233144 B | 5/2005 |
| TW | I1233144 B | 5/2005 |
| TW | I235408 B | 7/2005 |
| TW | I1235408 B | 7/2005 |
| TW | I244673 B | 12/2005 |
| TW | I1244673 B | 12/2005 |
| TW | 200714742 | 4/2007 |
| TW | I294257 B | 3/2008 |
| TW | I1294257 B | 3/2008 |
| WO | 96/16531 A1 | 5/1996 |
| WO | 02079815 A2 | 10/2002 |
| WO | 2005-047180 A1 | 5/2005 |
| WO | 2007/015779 A2 | 2/2007 |
| WO | 2012160145 A1 | 11/2012 |
| WO | 2015/022621 A1 | 2/2015 |
| WO | 2016/089424 A1 | 6/2016 |
| WO | 2016/089427 A1 | 6/2016 |
| WO | 2016/104076 A1 | 6/2016 |

OTHER PUBLICATIONS

European Search Report, issued in EP 09805431.5 dated Apr. 8, 2016, 6 pages.
Taiwanese Office Action, issued in TW 10521126650, dated Sep. 9, 2016, 10 pages.
Taiwanese Office Action, issued in TW 10521126670, dated Sep. 9, 2016, 9 pages.
Chinese Office Action, issued in CN 201510505370.5 dated Nov. 28, 2016, including English language translation, 22 pages.
International Search Report and Written Opinion, issued in PCT/US2016/061134 dated Jan. 9, 2017, 24 pages.
International Search Report and Written Opinion, issued in PCT/US2016/060979 dated Jan. 9, 2017, 16 pages.
Taiwanese Office Action, issued in TW 105103045, dated Dec. 30, 2016, including English language translation, 7 pages.
Garcia-Cespedes, et al., "Carbon nanotubes grown by asymmetric bipolar pulsed-DC PECVD", Diamond and Related Materials, vol. 16, pp. 1131-1135, Jan. 25, 2007.
PCT International Search Report and Written Opinion, issued in PCT/US 09/52679 dated Sep. 28, 2009, 12 pages.
L. Bardos, et al., "Linear Arc Discharge (LAD)—Radio Frequency Hollow Cathode Plasma Source for Low Pressure Processing," 1996 Society of Vacuum Coaters, 39th Annual Technical Conference Proceedings (1996), ISSN 0737-5921, pp. 128-132.
L. Bardos, et al., "PECVD by Hollow Cathodes," 1998 Society of Vacuum Coaters, 41st Annual Technical Conference Proceedings (1998), ISSN 0737-5921, pp. 315-320.
A. Belkind, et al., "Linear Plasma Source for Reactive Etching and Surface Modification," 1995 Society of Vacuum Coaters, 38th Annual Technical Conference Proceedings (1995), ISSN 0737-5921, pp. 432-436.
A. E. Delahoy, et al., "Transparent and semitransparent conducting film deposition by reactive-environment, hollow cathode sputtering," American Vacuum Society, J. Vac. Sri, Technol. A 23(4), Jul./Aug. 2005, pp. 1215-1220.
J. Madocks, et al., "Large Area Plasma Enhanced Chemical Vapor Deposition of SiO2 on Glass and Plastic," 2007 Society of Vacuum Coaters, 50th Annual Technical Conference Proceedings (2007), ISSN 0737-5921, pp. 233-238.
A.A. Pradhan, et al., "High Deposition Rate Reactive Sputtering with Hollow Cathode," 2002 Society of Vacuum Coaters, 45th Annual Technical Conference Proceedings (2002), ISSN 0737-5921, pp. 96-100.
C. M. Horwitz, "Silicon deposition in diode and hollow-cathode systems," 1989 American Vacuum Society, J. Vac. Sci. Technol. B 7 (3), May/Jun. 1989, pp. 443-449.
S.K. Deb, "The Role of Vacuum Coatings in Cost-Effective Photovoltaic Technologies," Society of Vacuum Coaters, 51st Annual Technical Conference Proceedings, Apr. 19-24, 2008, ISSN 0737-5921, pp. 101-106.
Japanese Office Action issued in JP 2011-522159 dated Jun. 25, 2013, including English language translation, 8 pages.
Argentine Office Action issued in AR 072911 A1, dated Jun. 11, 2013, 4 pages.
Eurasian Office Action issued in EA 201100298 dated Mar. 16, 2013, 2 pages.
Phillippine Office Action issued in PH 1/2011/500255 dated Jul. 16, 2013, 1 page.
Japanese Office Action issued in JP 2011-522159 dated Mar. 16, 2014, including English language translation, 8 pages.

(56) References Cited

OTHER PUBLICATIONS

M. Mildner et al., "13.56 MHz hollow cathode jet matrix plasma source for large area surface coating," Surface and Coatings Technology, vol. 112, pp. 366-372, XP000983344 (1999).
Extended European Search Report, issued in EP 09805431.5 dated Aug. 4, 2014, 16 pages.
Taiwanese Office Action, issued in TW 098126292 dated Mar. 23, 2015, including English language translation, 41 pages.
Korean Office Action, issued in KR 10-2011-7005282 dated Aug. 22, 2015, including English language translation, 21 pages.
Chinese Office Action, issued in CN 2009801395606 dated Dec. 29, 2014, including English language translation, 9 pages.
D. Child et al., "Enhanced Hollow Cathode Plasma Source for Low Pressure Electron-Beam Deposition Processes", 2014 Society of Vacuum Coaters 505/856-7188, ISSN 0737-5921, May 2014, 6 pages.
B. Buchholtz, "Physics of Ion Beam Sources" 7 pages.
International Search Report and Written Opinion, issued in PCT/US2014/068919 dated Feb. 24, 2015, 13 pages.
International Search Report and Written Opinion, issued in PCT/US14/68858 dated Mar. 5, 2015, 12 pages.
M. Proschek et al., "The effect of phase difference between powered electrodes on RF plasmas", Plasma Sources Sci Technol. 14, 2005, 407-411.
United Arab Emirates Office Action issued in UAE 119/2011 dated Apr. 10, 2016, 17 pages.
Japanese Office Action, issued in JP 2015-134085 dated Aug. 23, 2016, including English language translation, 9 pages.
Japanese Office Action, issued in JP 2015-134098 dated Aug. 30, 2016, including English language translation, 10 pages.
Japanese Office Action, issued in JP 2015-134106 dated Aug. 30, 2016, including English language translation, 10 pages.
Japanese Office Action, issued in JP 2015-134112 dated Aug. 2, 2016, including English language translation, 5 pages.
Japanese Office Action, issued in JP 2015-134116 dated Aug. 30, 2016, including English language translation, 10 pages.
Chinese Office Action, issued in CN 201410641340.2 dated Jun. 2, 2016, including English language translation, 11 pages.
A. E. Delahoy, et al., "Transparent and semitransparent conducting film deposition by reactive-environment, hollow cathode sputtering," American Vacuum Society, J. Vac. Sci. Technol. A 23(4), Jul./Aug. 2005, pp. 1215-1220.
Philippine Office Action issued in PH 1/2011/500255 dated Jul. 16, 2013, 1 page.
Japanese Office Action, issued in JP 2011-522159 dated Mar. 18, 2014, including English language translation, 8 pages.
Indian First Examination Report issued in IN 357/MUMNP/2011 dated Aug. 21, 2017, including English language translation, 10 pages.
Non-final Office Action, issued in U.S. Appl. No. 15/645,774, dated Aug. 28, 2017, 58 pages.
Chinese Office Action, issued in CN 201510505383.2 dated May 17, 2017, including English language translation, 24 pages.
Chinese Office Action, issued in CN 201510505381.3 dated Jun. 5, 2017, including English language translation, 19 pages.
Chinese Office Action, issued in CN 201510505370.5 dated Jul. 21, 2017, including English language translation, 23 pages.
Japanese Office Action, issued in JP 2015-134112 dated Jul. 4, 2017, including English language translation, 5 pages.
Japanese Office Action, issued in JP 2015-134116 dated Mar. 28, 2017, including English language translation, 9 pages.
Non-final Office Action, issued in U.S. Appl. No. 14/486,779, dated Mar. 24, 2017, 80 pages.
Non-final Office Action, issued in U.S. Appl. No. 14/148,606, dated Apr. 6, 2017, 36 pages.
Non-final Office Action, issued in U.S. Appl. No. 14/975,286, dated Apr. 7, 2017, 61 pages.
Japanese Office Action, issued in JP 2015-134098 dated Jan. 10, 2017, including English language translation, 11 pages.
Final Office Action, issued in U.S. Appl. No. 14/486,726, dated May 17, 2017, 38 pages.
Office Action issued for Chinese Patent Application No. 201510505381.3, dated Feb. 1, 2018, along with the corresponding English translation (15 pages).
Office Action issued for Chinese Patent Application No. 201510505370.5, dated Feb. 5, 2018, along with the corresponding English translation (23 pages).
Office Action issued for U.S. Appl. No. 15/645,774 dated Mar. 9, 2018 (25 pages).
Office Action issued in U.S. Appl. No. 14/148,606 dated Apr. 5, 2018 (18 pages).
Communication issued in European Patent Application No. 09805431.5 dated Apr. 12, 2018 (10 pages).
Notification issued in Eurasian Patent Application No. 201400544 dated Dec. 7, 2017, 4 pages.
Office Action issued in U.S. Appl. No. 14/975,286 dated Oct. 23, 2017, 17 pages.
Notification of Reasons for Rejection issued in Japanese Application No. 2015-134116 dated Oct. 24, 2017, along with English translation, 9 pages.
Office Action issued in U.S. Appl. No. 14/486,779 dated Sep. 28, 2017, 8 pages.
Office Action issued in U.S. Appl. No. 14/486,726 dated Oct. 6, 2017, 15 pages.
Office Action issued in U.S. Appl. No. 14/148,606 dated Oct. 10, 2017, 18 pages.
Office Action issued for Chinese Patent Application No. 201510505383.2 dated Feb. 1, 2018, along with English translation (4 pages).
Office Action issued for Japanese Patent Application No. 2017-093637 dated May 29, 2018, along with English translation, 10 pages.
Office Action issued for Japanese Patent Application No. 2017-529720 dated Sep. 25, 2018, along with English translation, 12 pages.
Office Action issued for U.S. Appl. No. 15/532,855 dated Oct. 12, 2018, 19 pages.
Office Action issued for U.S. Appl. No. 15/645,774 dated Oct. 18, 2018, 28 pages.
Office Action issued for Japanese Patent Application No. 2017-146662 dated Aug. 7, 2018, along with English translation, 6 pages.
Office Action issued for Japanese Patent Application No. 2015-134106 dated Aug. 28, 2018, along with English translation, 13 pages.
Office Action issued for U.S. Appl. No. 14/486,726 dated Jun. 22, 2018, 48 pages.
Office Action issued for U.S. Appl. No. 14/975,286 dated Jun. 28, 2018, 44 pages.
Office Action issued for U.S. Appl. No. 15/645,774 dated Jul. 12, 2018, 63 pages.
Examination Report, in corresponding Philippine Application No. 1/2015/500540, dated May 8, 2018, 2 pages.
Extended European Search Report dated Jul. 3, 2018, issued in European Patent Application No. 14907243.1, 10 pages.
Extended European Search Report dated Jul. 16, 2018, issued in European Patent Application No. 14907576.4, 9 pages.
Office Action issued for Japanese Patent Application No. 2017-529717 dated Nov. 27, 2018, along with English translation, 4 pages.
Office Action issued for Eurasian Patent Application No. 201791234 dated Dec. 11, 2018, along with English translation, 2 pages.
Office Action issued for Eurasian Patent Application No. 201791237 dated Dec. 26, 2018, along with English translation, 4 pages.
Office Action issued for Chinese Patent Application No. 201510505370.5 dated Dec. 14, 2018, along with English translation, 6 pages.
Office Action issued for U.S. Appl. No. 15/532,845 dated Dec. 31, 2018, 33 pages.
Office Action issued for Chinese Patent Application No. 201480084542.X dated Dec. 29, 2018, along with English translation, 24 pages.
Office Action issued for Chinese Patent Application No. 20148004528.X dated Feb. 28, 2019, along with English translation, 18 pages.

(56) References Cited

OTHER PUBLICATIONS

Office Action issued for Japanese Patent Application No. 2017-146662 dated Mar. 26, 2019, along with English translation, 11 pages.
Examination Report, in corresponding Philippine Patent Application No. 1/2015/500539, dated Apr. 10, 2019, 5 pages.
Office Action issued for U.S. Appl. No. 15/532,855 dated May 2, 2019, 57 pages.
Office Action issued for Japanese Patent Application No. 2018-532069 dated May 28, 2019, along with English translation, 15 pages.
Office Action issued in Brazilian Patent Application No. PI0916880-0 dated May 28, 2019, 7 pages.
Extended European Search Report issued in European Patent Application No. 16866871.3, dated Jul. 3, 2019, 10 pages.
Substantive Examination Report issued in Philippine Patent Application No. 1/2015/500541, dated Jul. 5, 2019, 7 pages.
Office Action issued for U.S. Appl. No. 15/532,845 dated Jul. 9, 2019, 67 pages.
Extended European Search Report issued in European Patent Application No. 16876262.3, dated Jul. 19, 2019, 11 pages.
Office Action issued for Japanese Patent Application No. 2017-529720 dated Jul. 23, 2019, along with English translation, 17 pages.
Office Action issued in Chinese Patent Application No. 201680078860.4, dated Aug. 1, 2019, with English translation, 31 pages.
Office Action issued in Indonesian Patent Application No. P-00201702394 dated Aug. 19, 2019 (no English translation), 3 pages.
Office Action issued in Eurasian Patent Application No. 201791234, dated Aug. 27, 2019, with English translation, 3 pages.
Office Action issued in connection with Eurasian Patent Application No. 201791237, dated Aug. 29, 2019, with English translation, 3 pages.
Office Action issued in Chinese Patent Application No. 201480084542.X, dated Sep. 11, 2019, with English translation, 22 pages.
Office Action issued in Chinese Patent Application No. 201680081988.6, dated Sep. 25, 2019, with English translation, 35 pages.
Office Action issued in Indonesian Patent Application No. P-00201704208, dated Oct. 8, 2019 (no English translation), 3 pages.
Office Action issued in Eurasian Patent Application No. 201891175, dated Oct. 16, 2019, (no English translation), 2 pages.
Office Action issued in Chinese Patent Application No. 201480084528.X, dated Nov. 7, 2019, with English translation, 16 pages.
Office Action issued for U.S. Appl. No. 15/532,845 dated Dec. 12, 2019, 58 pages.

* cited by examiner

METHOD OF EXTRACTING AND ACCELERATING IONS

BACKGROUND OF THE INVENTION

Ion sources are commonly used for a variety of applications, including substrate treatment in the form of heating, cleaning, surface etching, and chemically modifying a surface. Ion sources can be used for depositing oxides, diamond-like carbon, and other useful coatings. Ion sources can be used to support vacuum deposition processes and to modify thin film growth. For example, ion sources can be used to densify, crystalize, or chemically react with depositing atoms. Virtually all ion sources are designed to operate in the reduced pressure of a vacuum chamber. Some ion sources can be used as low-thrust, long-running engines for spacecraft acceleration.

In their most basic form, ion sources typically consist of a plasma-forming component with additional components to extract and accelerate ions from that plasma. These additional components typically create electric or magnetic fields within the plasma gas other than fields created by the plasma-forming component. These additional fields exert attraction or repulsion forces on ions and result in acceleration of ions. The additional components also add complexity to the overall ion source.

The majority of ions in plasmas are positively charged. That is, they are ionized atoms or molecules, typically missing one or two electrons. When these ions are accelerated out of a plasma, the resulting ion beam often carries a greater number of positively charged particles than negative particles (e.g., electrons). This electrical imbalance can create problems with vacuum hardware or processes. To correct these situations, often an additional electron source device such as a hot filament thermionic electron emitter or hollow cathode electron source is added to inject charge balancing electrons into the ion beam. These electron sources are commonly referred to as neutralizers. As with the other additional components, the use of a neutralizer adds complexity to the overall ion source.

One example of a plasma-forming component used in ion sources is a hollow cathode. Hollow cathodes include linear hollow cathodes and point hollow cathodes. Linear hollow cathodes are not commonly used in ion sources; point hollow cathodes are occasionally used in an ion source being employed as a thruster (e.g. for spacecraft acceleration), but such point plasma sources are not usually used for coating substrates (e.g., such as for PECVD coating processes). When hollow cathodes are used, similarly to most ion sources, the extraction of ions from hollow cathode plasmas requires attaching additional components such as separately powered electrodes and magnets. These components often add significant degrees of mechanical and process complexity to an ion source. Further, when using a hollow cathode as the plasma-forming component, known ion sources rely on a dedicated anode structure or separate anodic orifice, resulting in further complexity.

Another problem with ion sources is that during dielectric deposition processes, a dielectric coating can build up on the anode structure. Additionally, when ion sources are used in plasma-enhanced chemical vapor deposition (PECVD) processes, the PECVD processes are known for contaminating nearby vacuum chamber hardware including cathode or anode surfaces (for example, contamination may occur from precursor gasses used in these processes reacting with cathode or anode surfaces).

Accordingly, there is a need for an ion source that overcomes these and other disadvantages of known ion sources.

BRIEF SUMMARY OF THE INVENTION

The following commonly-assigned applications describe various hollow cathode plasma sources, such as may be used in embodiments of the present invention: U.S. application Ser. No. 12/535,447, now U.S. Pat. No. 8,652,586; U.S. application Ser. No. 14/148,612; U.S. application Ser. No. 14/148,606; U.S. application Ser. No. 14/486,726; U.S. application Ser. No. 14/486,779; PCT/US14/068919; and PCT/US14/68858. Each of these applications is incorporated herein by reference in its entirety.

Additionally, commonly-assigned U.S. application Ser. No. 14/942,737, filed on Nov. 16, 2015, entitled "Plasma Device Driven by Multiple-Phase Alternating or Pulsed Electrical Current," and U.S. application Ser. No. 14/942,673, filed on Nov. 16, 2015, entitled "Method of Producing Plasma by Multiple-Phase Alternating or Pulsed Electrical Current," are both incorporated herein by reference in their entirety.

Embodiments of the present invention comprise hollow-cathode-based ion sources of surprising simplicity. Embodiments of the present invention can create an energetic ion beam without requiring any additional electrodes, accelerating grids, magnetic fields, neutralizers, or other additional components to extract and accelerate ions. Embodiments of the present invention can also protect cathode and anode surfaces from contamination.

According to a first aspect of the invention, an ion source is provided. The ion source includes a chamber. The ion source further includes a first hollow cathode having a first hollow cathode cavity and a first plasma exit orifice and a second hollow cathode having a second hollow cathode cavity and a second plasma exit orifice. The first and second hollow cathodes are disposed adjacently in the chamber. The ion source further includes a first ion accelerator between and in communication with the first plasma exit orifice and the chamber. The first ion accelerator forms a first ion acceleration cavity. The ion source further includes a second ion accelerator between and in communication with the second plasma exit orifice and the chamber. The second ion accelerator forms a second ion acceleration cavity. The first hollow cathode and the second hollow cathode are configured to alternatively function as electrode and counter-electrode to generate a plasma. Each of the first ion acceleration cavity and the second ion acceleration cavity are sufficient to enable the extraction and acceleration of ions According to a second aspect of the invention, a method of extracting and accelerating ions is provided. The method includes providing a ion source, such as, for example, the ion source according to the first aspect of the invention. The method further includes generating a plasma using the first hollow cathode and the second hollow cathode. The first hollow cathode and the second hollow cathode are configured to alternatively function as electrode and counter-electrode. The method further includes extracting and accelerating ions. Each of the first ion acceleration cavity and the second ion acceleration cavity are sufficient to enable the extraction and acceleration of ions.

In some embodiments (according to any of the aspects of the invention), the extracted and accelerated ions from at least one of the first ion acceleration cavity and the second ion acceleration cavity form one of: a single narrow beam, a single large-area beam, an array of single beams, and a continuous linear beam curtain. In some embodiments, the extracted and accelerated ions from at least one of the first ion acceleration cavity and the second ion acceleration cavity form a collimated ion beam.

In some embodiments, the first hollow cathode and the first ion accelerator are at a first same electric potential difference and the second hollow cathode and the second ion accelerator are at a second same electric potential difference. In some embodiments, the first hollow cathode and the first ion accelerator are at a first same polarity relative to an electric potential of the plasma and the second hollow cathode and the second ion accelerator are at a second same polarity relative to the electric potential of the plasma.

In some embodiments, the first ion accelerator comprises a portion of the first hollow cathode and/or the second ion accelerator comprises a portion of the second hollow cathode. In some embodiments, the first ion acceleration cavity comprises a slot in the first ion accelerator and/or the second ion acceleration cavity comprises a slot in the second ion accelerator. In some embodiments, the first ion accelerator and the first hollow cathode are electrically insulated from each other and/or the second ion accelerator and the second hollow cathode are electrically insulated from each other. In some embodiments, at least one of the electric potential of the first ion accelerator and the electric potential of the second ion accelerator is switching at a frequency between negative and positive with respect to the electric potential of the plasma. In some embodiments, the first ion accelerator is electrically connected to an exterior of the first hollow cathode and/or the second ion accelerator is electrically connected to an exterior of the second hollow cathode. In some embodiments, the first ion accelerator is electrically connected to an interior of the first hollow cathode and/or the second ion accelerator is electrically connected to an interior of the second hollow cathode.

In some embodiments, at least one of the first ion acceleration cavity and the second ion acceleration cavity is in the form of one of a counterbore, a rectangular slot, a semicircle, a cone, an inverted cone, and a bell shape.

In some embodiments, the interior surfaces of at least one of the first ion accelerator and the second ion accelerator are electron-emitting and electron-accepting. In some embodiments, external surfaces of at least one of the first hollow cathode, the first ion accelerator, the second hollow cathode, and the second ion accelerator are electrically insulated. In some embodiments, the external surfaces are electrically insulated by at least one of a polymer and a non-conductive ceramic. In some embodiments, the external surfaces are electrically insulated by a dark space shield.

In some embodiments, the chamber comprises a vacuum chamber. In some embodiments, the first plasma exit orifice restricts gas flow between the first hollow cathode and the chamber and/or the second plasma exit orifice restricts gas flow between the second hollow cathode and the chamber. In some embodiments, at least one of the first ion acceleration cavity and the second ion acceleration cavity comprises an elongated cavity. In some embodiments, at least one of the first plasma exit orifice and the second plasma exit orifice comprises a plasma exit nozzle. In some embodiments, at least one of the first plasma exit orifice and the second plasma exit orifice comprises a plurality of plasma exit nozzles. In some embodiments, at least one of the first plasma exit orifice and the second plasma exit orifice comprises a linear slot.

In some embodiments, the first ion acceleration cavity partially encloses gas emerging from the first plasma exit orifice and/or the second ion acceleration cavity partially encloses gas emerging from the second plasma exit orifice. In some embodiments, an average energy of the extracted and accelerated ions is less than 100 eV. In some embodiments, an average energy of the extracted and accelerated ions is greater than 100 eV.

In some embodiments, the ion source further includes a source of power configured to power at least one of the first hollow cathode, the first ion accelerator, the second hollow cathode, and the second ion accelerator.

In some embodiments, the source of power operates at a root-mean-square AC voltage between 200V and 1000V. In some embodiments, the source of power operates at a root-mean-square AC voltage between 20V and 200V.

In some embodiments, the first and second hollow cathodes are configured such that, the hollow cathode serving as positive electrode is more positively biased than walls of the chamber. In some embodiments, the first and second ion accelerators are configured such that the first and second ion accelerators are biased more positively than the corresponding first and second hollow cathodes during the positive portion of the cycle for the respective ion accelerator and hollow cathode. In some embodiments, the first and second ion accelerators are configured such that the first and second ion accelerators are biased less positively than the corresponding first and second hollow cathodes during the positive portion of the cycle for the respective ion accelerator and hollow cathode. In some embodiments, the only electrically active surfaces consist essentially of an inner wall of each of the first and second hollow cathodes and an inner wall of each of the first and second ion accelerators. In some embodiments, the frequency that the first hollow cathode and the second hollow cathode alternate between electrode and counter-electrode is from about 1 kHz to about 1 MHz.

In some embodiments, at least one of the first ion acceleration cavity and the second ion acceleration cavity is angled to distribute ion bombardment to a common line. In some embodiments, the plasma is self-neutralizing. In some embodiments, the ion source is absent of any Hall current. In some embodiments, the ion source is absent of any accelerating grids. In some embodiments, the ion source is from about 0.1 m to about 4 m long and has uniform plasma and ion emission over the length of the ion source.

In some embodiments, the first ion acceleration cavity and the second ion acceleration cavity are sufficient to enable the extraction and acceleration of ions without the use of additional components to extract and accelerate ions from that plasma.

BRIEF DESCRIPTION OF THE SEVERAL VIEWS OF THE DRAWINGS

The accompanying drawings, which are incorporated herein and form part of the specification, illustrate various embodiments of the present disclosure and, together with the description, further serve to explain the principles of the disclosure and to enable a person skilled in the pertinent art to make and use the embodiments disclosed herein. In the drawings, like reference numbers indicate identical or functionally similar elements.

DETAILED DESCRIPTION OF THE INVENTION

Figure 1A:
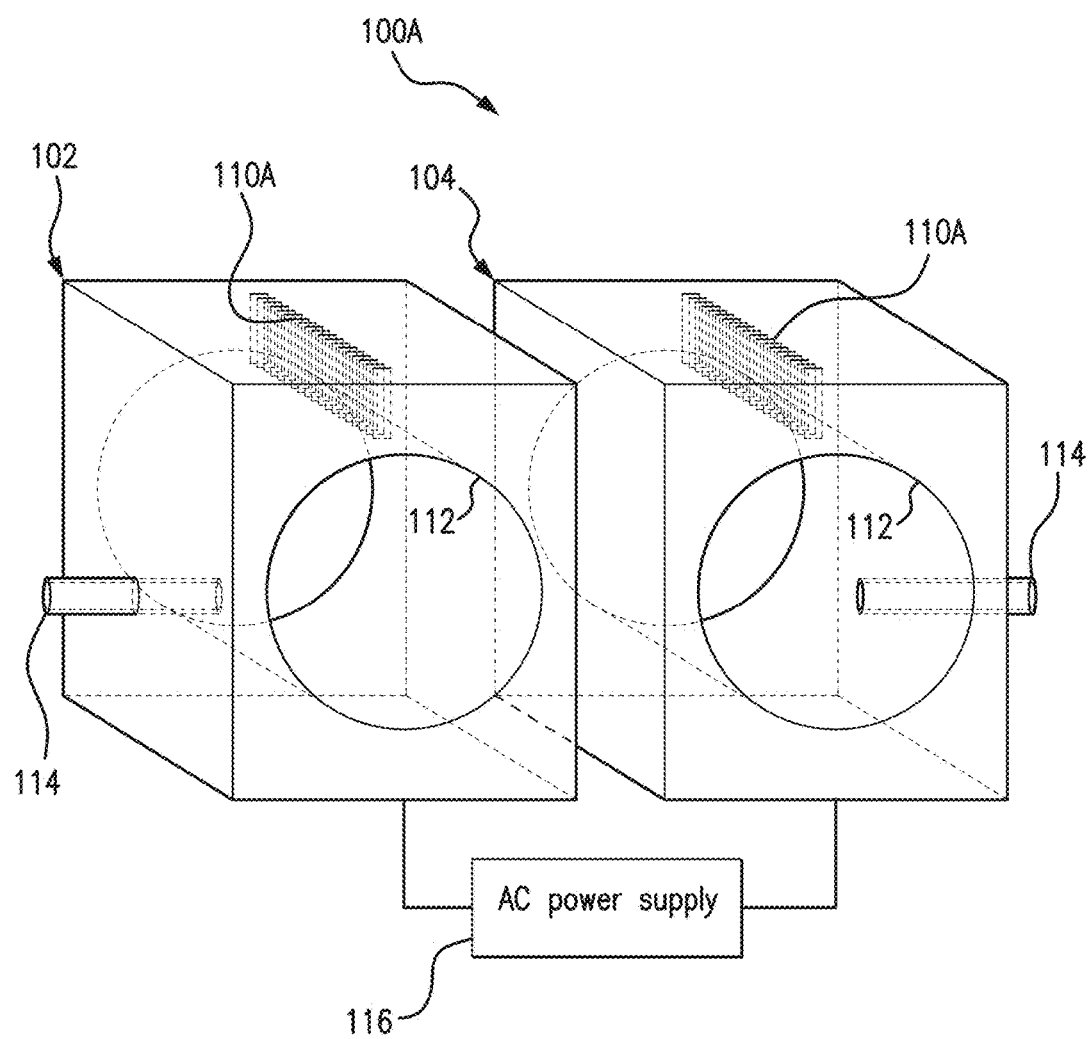
FIG. 1A illustrates a known hollow cathode plasma source with an array of nozzles as a plasma exit region.
Figure 1B:
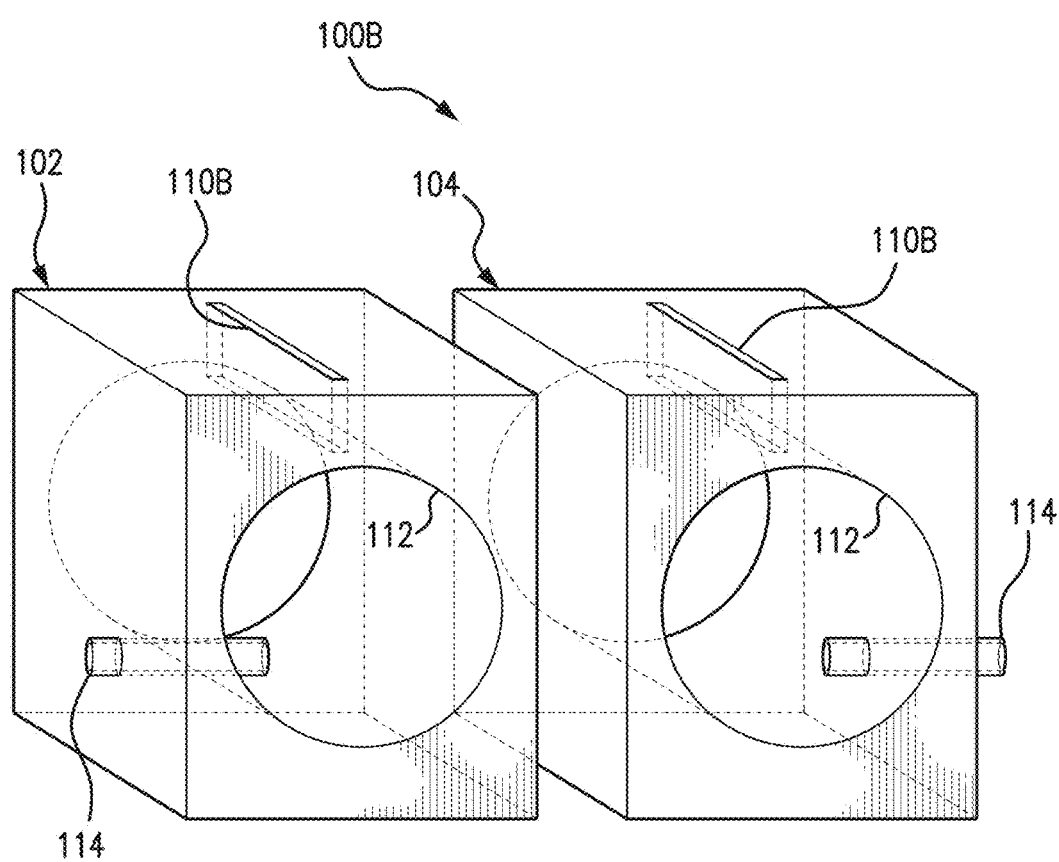
FIG. 1B illustrates a known hollow cathode plasma source with a linear slot as a plasma exit region.
Figure 1C:
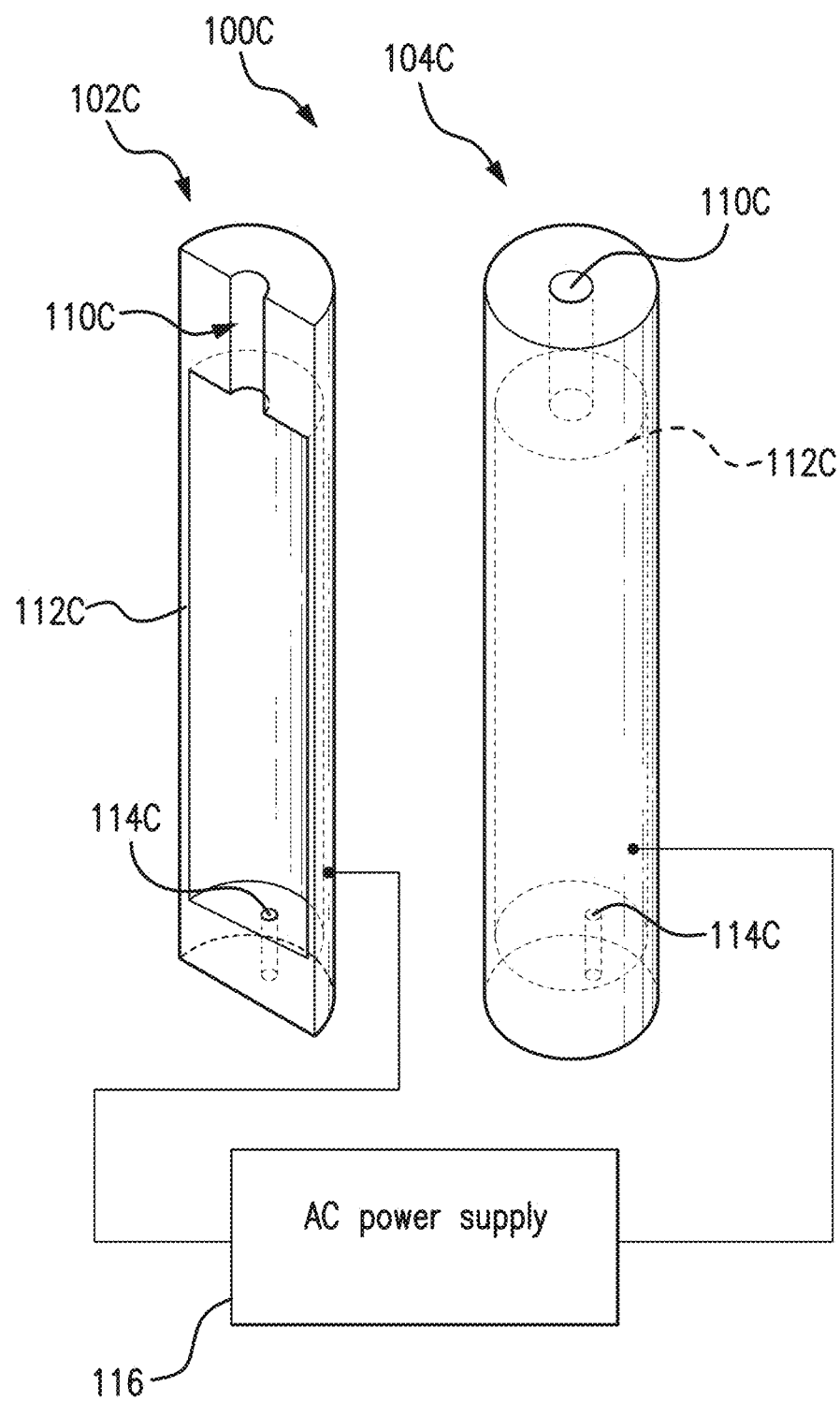
FIG. 1C illustrates a known hollow cathode plasma source with a single hole as plasma exit region.

FIGS. 1A, 1B, and 1C, illustrate known hollow cathode plasma sources 100A, 100B, 100C. As shown in FIG. 1A, hollow cathode plasma source 100A includes a first linear hollow cathode 102 and a second linear hollow cathode 104, each connected to power source 116. Each linear hollow cathode 102, 104 includes an interior hollow cathode cavity 112 and a gas inlet 114 to allow plasma-forming gasses to enter into the hollow cathode cavity 112. Additionally, the hollow cathodes 102, 104 include a plasma exit region. As shown in FIG. 1A, the plasma exit region consists of an array of holes or nozzles 110A leading from the hollow cathode cavity 112 to the process chamber that houses the hollow cathodes. As shown in FIG. 1B, the plasma exit region consists of a single slot 110B in the hollow cathode body. FIG. 1C shows a tubular or cylindrical point hollow cathode plasma source, including tubular hollow cathodes 102C, 104C each having a hollow cathode cavity 112C and a gas inlet 114C, analogous to the cavity and gas inlet of FIGS. 1A and 1B for a linear hollow cathode plasma source. As shown in FIG. 1C, the plasma exit region consists of a single hole 110C. The plasma source shown in FIG. 1C is a point source which results in an approximately 0-dimensional "point" of plasma, whereas the linear plasma sources of FIGS. 1A and 1B result in an approximately 1-dimensional "line" of plasma. One of skill in the art will recognize that the resulting plasma is not mathematically 0-dimensional or 1-dimensional, and that these terms are merely approximations for describing the plasma being generated by the plasma sources.

Power source 116 is electrically connected to each hollow cathode and comprises an alternating-current power source. The power source 116 causes the two hollow cathodes to have opposite polarity relative to each other. As this polarity switches, each hollow cathode will alternatively serve as cathode and anode. As is well known in the art, and as disclosed in previous applications by the present inventors (such as, for example, the applications incorporated by reference above), a bipolar power supply initially drives a first electron emitting surface to a negative voltage, allowing plasma formation, while the second electron emitting surface is driven to a positive voltage in order to serve as an anode for the voltage application circuit. This then drives the first electron emitting surface to a positive voltage and reverses the roles of cathode and anode. As one of the electron emitting surfaces is driven negative, a discharge forms within the corresponding cavity. The other cathode then forms an anode, causing electron current to flow from the cathodic hollow cathode to the anodic hollow cathode.

Note that in the figures, the hollow cathode cavities are shown as unenclosed, or open, solely for purposes of illustration. In practice, the hollow cathode cavity is surrounded by the hollow cathode body, and the only openings are from the gas inlet and the plasma exit region.

The linear hollow cathode plasma sources 100A and 100B illustrated in FIGS. 1A and 1B, respectively, are not usually used in ion sources. The point hollow cathode plasma source illustrated in FIG. 1C is occasionally used in an ion source being employed as a thruster (e.g. for spacecraft acceleration), but such point plasma sources are not usually used for coating substrates (e.g., such as for PECVD coating processes).

Figure 2A:
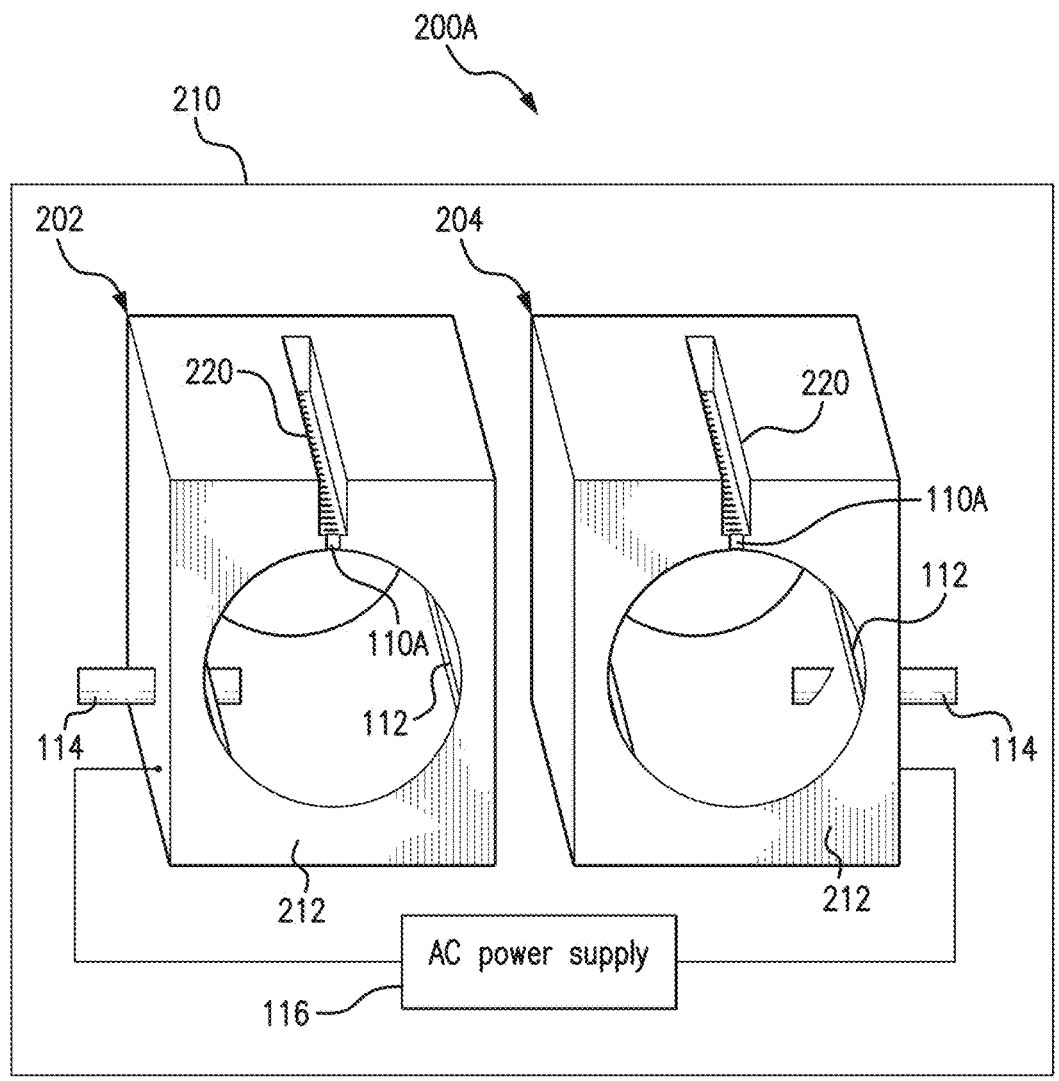
FIG. 2A illustrates a hollow cathode ion source with an array of nozzles as a plasma exit region according to exemplary embodiments of the present invention.
Figure 2B:
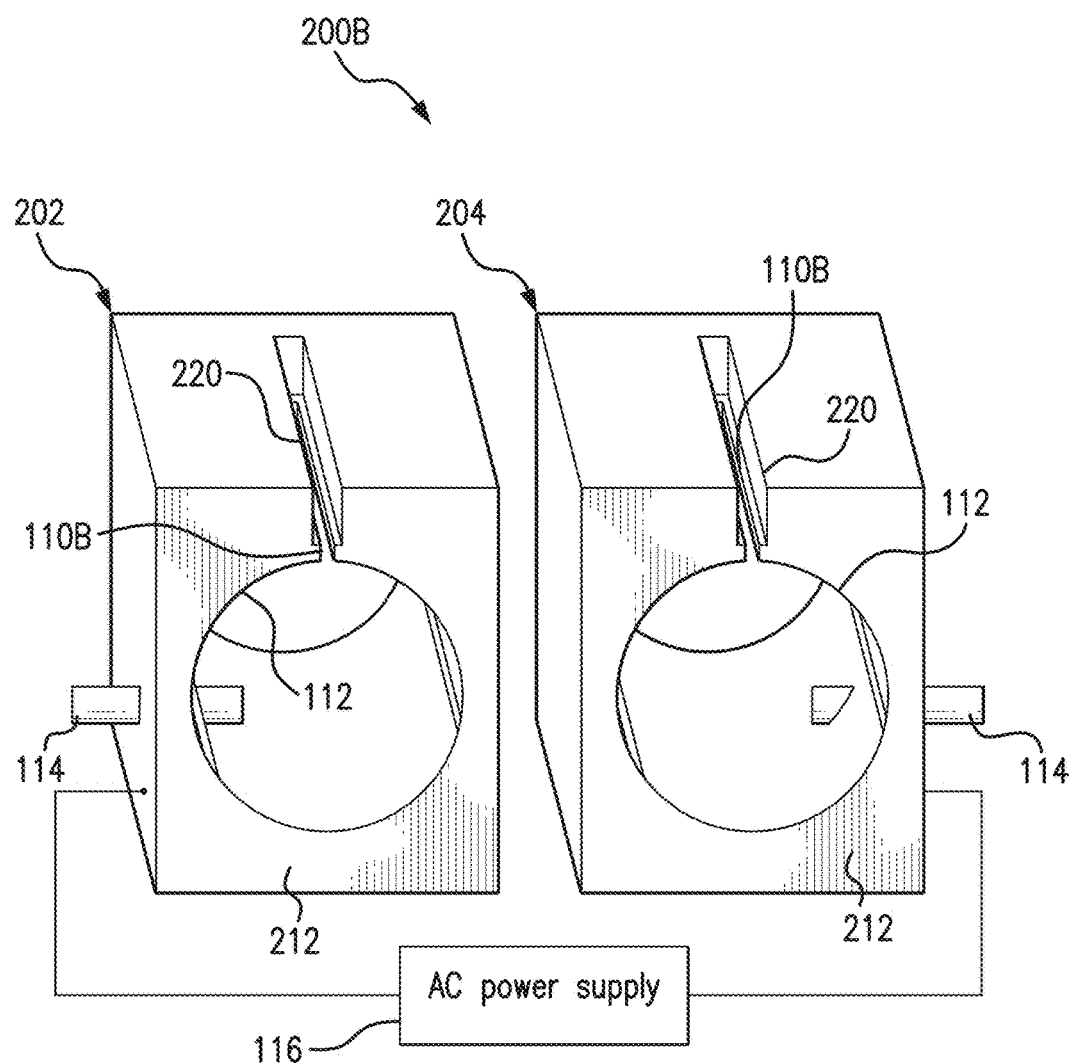
FIG. 2B illustrates a hollow cathode ion source with a linear slot as a plasma exit region according to exemplary embodiments of the present invention.
Figure 2C:
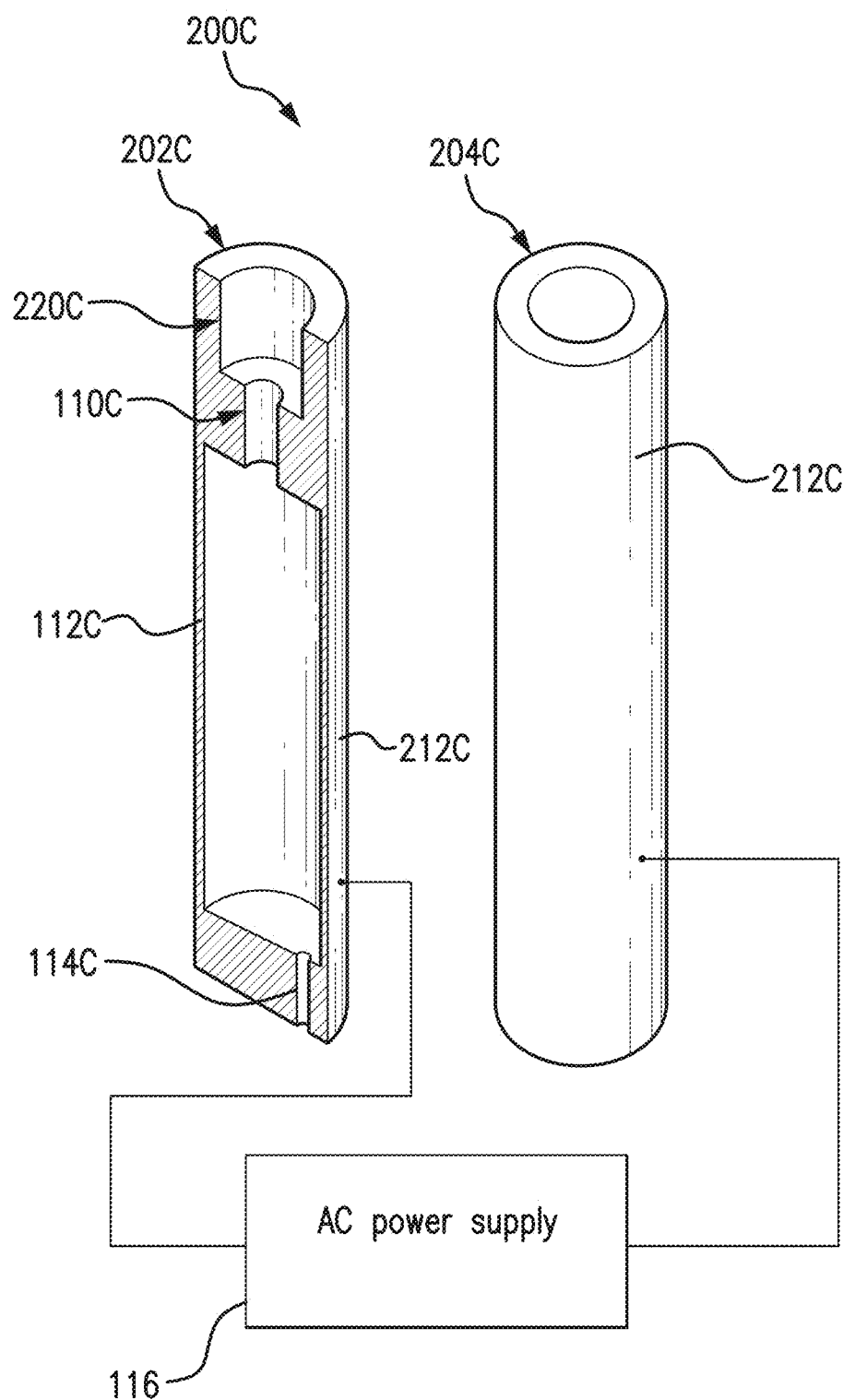
FIG. 2C illustrates a hollow cathode ion source with a single hole as a plasma exit region according to exemplary embodiments of the present invention.
Figure 3A:
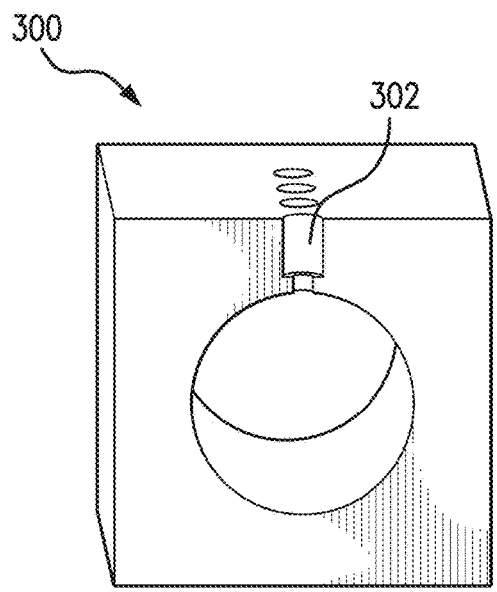
FIG. 3A illustrates an alternative ion acceleration cavity shape according to exemplary embodiments of the present invention.
Figure 3B:
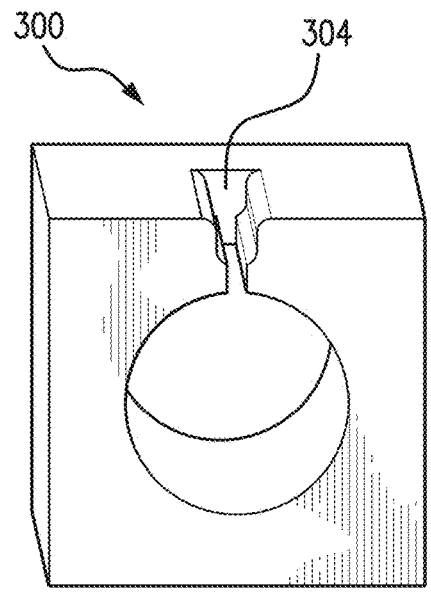
FIG. 3B illustrates an alternative ion acceleration cavity shape according to exemplary embodiments of the present invention.
Figure 3C:
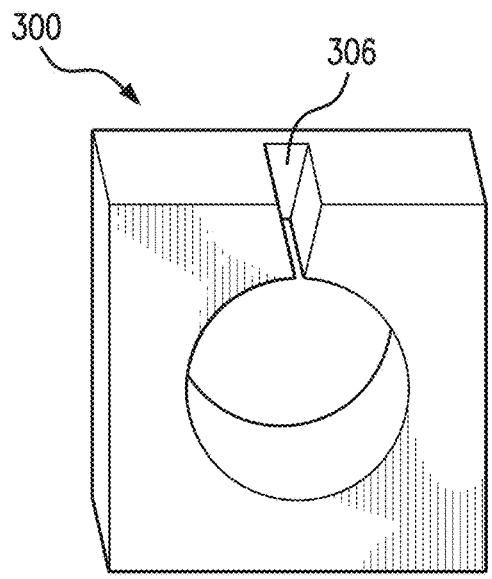
FIG. 3C illustrates an alternative ion acceleration cavity shape according to exemplary embodiments of the present invention.
Figure 3D:
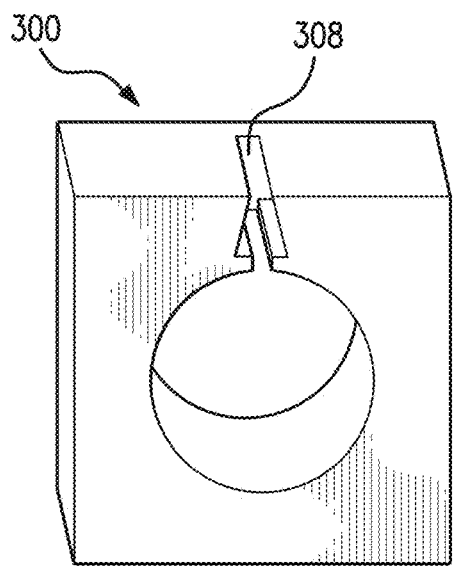
FIG. 3D illustrates an alternative ion acceleration cavity shape according to exemplary embodiments of the present invention.

FIGS. 2A, 2B, and 2C, illustrate hollow cathode ion sources 200A, 200B, and 200C, respectively, according to exemplary embodiments of the present invention. As shown in FIG. 2A, hollow cathode ion source 200A includes a first ion accelerating unit 202 and a second ion accelerating unit 204, each connected to power source 116. Each ion accelerating unit 202, 204 includes a hollow cathode body 212, an interior hollow cathode cavity 112, and a gas inlet 114 to allow plasma-forming gasses to enter into the hollow cathode cavity 112. Additionally, the ion accelerating units 202, 204 include a plasma exit region. As shown in FIG. 2A, the plasma exit region consists of an array of holes (or nozzles) 110A leading from the hollow cathode cavity 112. Whereas in hollow cathode plasma source 100A, the plasma exit region led from the hollow cathode cavity to the process chamber that houses the hollow cathodes; in the ion source 200A, the plasma exit region consisting of an array of holes 110A leads from the hollow cathode cavity 112 to an ion acceleration cavity 220. As shown in FIG. 2B, the plasma exit region consists of a single slot 110B in the hollow cathode body leading to an ion acceleration cavity 220. FIG. 2C shows ion accelerating units 202C, 204C each having a tubular hollow cathode body 212C, a hollow cathode cavity 112C, and a gas inlet 114C. As shown in FIG. 2C, the plasma exit region consists of a single hole 110C leading to an ion acceleration cavity 220C.

Referring now to FIG. 2A, hollow cathode ion source 200A includes a chamber 210 which houses the ion accelerating units 202, 204. In some embodiments, chamber 210 is a vacuum chamber.

As the voltage or polarity of the hollow cathodes changes, relative to the plasma potential, this creates an electric repulsive force that will accelerate ions. During the positive pulse, positive ions are repulsed and accelerated from the cavity. During the negative pulse, negative ions are accelerated. Plasma activated oxygen is known to produce negative ions which make embodiments of this ion source useful for accelerating ion beams of inert or oxygen reactive gas, due to the alternating function of each hollow cathode as anode and cathode. Rather than requiring additional components and separate electric or magnetic fields, the hollow cathode plasma source itself, in combination with the ion acceleration cavity, creates the necessary repulsive force to extract and accelerate ions. Additionally, most existing ion sources do not work well with oxygen, as components of existing ion sources can have disadvantageous reactions with oxygen.

Although plasma is a gas phase material, it is highly electrically conductive. Due to this conductivity, plasma may carry a charge or electrical voltage bias. The plasma formed by the hollow cathodes of embodiments of this invention are non-equilibrium, non-thermal plasmas which typically carry a charge of from ground potential to a few tens of volts (typically no more than 30V) positive.

The hollow cathode body and ion acceleration cavity should also be functionally at the same electrical potential or at least the same polarity relative to the plasma potential. Thus, the first ion accelerating unit's hollow cathode body and the corresponding ion acceleration cavity should be at a first same potential or polarity and the second ion accelerating unit's hollow cathode body and the corresponding ion acceleration cavity should be at a second same potential or polarity. Part of the simplicity of embodiments of the present invention is that no additional power supplies or electrodes of separate polarity are needed to accelerate ions. In some embodiments, both the hollow cathode cavity walls and the ion acceleration cavity walls are electrically connected to one power supply.

As the hollow cathode bodies and ion acceleration cavities alternate from negative to positive polarity, they alternatively switch between serving as electron emitters and electron collectors. An electron current is established between the hollow cathodes. It is advantageous to restrict the electron emitting and collecting surfaces to specific areas of the device. While not necessary, the ion source of the disclosed embodiments functions optimally when electron emission and collection occurs on the hollow cathode plasma cavity walls, the ion acceleration cavity walls, and the plasma exit orifice walls, and when the orifices are conductive.

According to some embodiments, an average energy, or alternatively a median energy, of the extracted and accelerated ions is greater than 100 eV. In other embodiments, the average or median energy is less than 100 eV. For example, using a "cold" hollow cathode plasma source, which operates at approximately 500V, the ion source is capable of etching which indicates ion energies in excess of 100 eV, and as high as 1500 eV. Using a "hot" hollow cathode plasma source, the ion beam does not have sufficient energy to etch, which indicates ion energies less than 100 eV, and on the order of 10 eV. This capability to produce widely varying ion energies is advantageous. In particular, ion sources with energies on the order of 10 eV are difficult to design using conventional ion source technology. This is especially true regarding linear ion sources.

It will be appreciated that each of ion accelerating units 202, 202C, 204, 204C is capable of forming an ion beam by extracting and accelerating ions. Accordingly, in some embodiments, there will be at least two distinct ion beams formed from the ion source.

As will be appreciated by one of skill in the art by the present disclosure, power source 116 may be a conventional bipolar (two-phase) power source. Power source 116 may also be a multiphase power source, and may be electrically connected to more than two ion accelerating units. For example, as described in U.S. application Ser. Nos. 14/942,737 and 14/942,673, ion sources 200A, 200B, 200C (or any other ion source enabled by this disclosure) can include at least three ion accelerating units, each including hollow cathode bodies that are electrically powered by at least three phase-offset waves.

Hollow cathodes, according to the exemplary embodiments disclosed herein, must be sufficiently close to each other to allow an electron current to flow between hollow cathodes of opposite polarity. In some embodiments, this proximal distance may be from approximately 5 mm to 500 mm. As illustrated in FIGS. 2A, 2B and 2C, the hollow cathode bodies 212, 212C are of elongated design. In some embodiments, a length of these hollow cathodes may be from about 50 mm to about 10 meters, and in some embodiments the length may be even greater than 10 meters. In some embodiments, the hollow cathode bodies are straight, but the hollow cathode bodies can also be circular or of a convoluted shape. For example, in some embodiments, a circular and concentric arrangement of hollow cathode bodies can result in a single large area ion beam.

One of skill in the art will also appreciate that, while ion accelerating units 202, 202C, 204, 204C are shown as rectangular or tubular, ion accelerating units and the cavities formed within those ion accelerating units, such as the hollow cathode cavities, in accordance with embodiments of this invention, may include other shapes. Hollow cathode cavity widths (or diameters) may be (for example) from about 8 mm to about 100 mm. In certain embodiments, operating pressure inside the chamber may be from about 0.1 milliTorr (0.013 Pascals) to about 100 milliTorr (13 Pascals), or more typically from about 1.0 milliTorr (0.13 Pascals) to about 50 milliTorr (6.7 Pascals). The general chamber pressure will typically be less than the pressure within the hollow cathode cavity. As will be appreciated, plasma gas pressure within the cavity can be controlled so that cavity width (or diameter) is inversely proportional to plasma gas pressure within the cavity.

The construction materials for a hollow cathode body, including cavity walls, must be sufficiently electrically conductive so that electrons can be emitted from cavity wall surfaces and the walls can carry the necessary electrical current to sustain the discharge. Examples of cavity wall construction materials include metals, metal alloys, metal compounds, carbon, carbon compounds, conductive ceramics, and/or semiconductors. Commonly used materials are metal, metal alloys and/or carbon in the graphitic form. In some cases cavity wall materials may be chosen for desirable electron emission properties. Cavity walls may comprise materials with low work function or high secondary electron emission coefficients which allow lower operating voltages and increased electron current. In some cases these specialized materials may comprise an interior cavity wall coating on a metal or carbon base (for example, a tungsten-carbide coating to reduce sputtering). Embodiments of the present invention are effective with a wide variety of cavity wall materials.

In some embodiments, the hollow cathode cavity is from about 8 mm to about 100 mm in width or diameter. The plasma exit region may be from about 1 mm to about 20 mm, or from about 2 mm to about 15 mm, in width or diameter. The ion acceleration cavity, in some embodiments, is wider (or has a larger diameter) than the plasma exit region. In some embodiments, the ion acceleration cavity has a width or diameter from about 2 mm to 25 mm, or about 3 mm to 20 mm. In some embodiments, the ion acceleration cavity may be a rectangular slot (e.g., as depicted in FIGS. 2A and 2B) or a circular slot (e.g., as depicted in FIG. 2C). However, as will be appreciated, other shapes are possible. For example, FIGS. 3A-D illustrate alternative ion acceleration cavity shapes according to exemplary embodiments of the present invention. As shown in FIGS. 3A-D, ion accelerating unit 300 includes an ion acceleration cavity 302, 304, 306, 308. The ion acceleration cavity may include an array of cylindrically-shaped cavities (302) (shown in FIG. 3A), a bell-shaped ion acceleration cavity (304) (shown in FIG. 3B), or a widening (306) (shown in FIG. 3C) or narrowing (308) (shown in FIG. 3D) cone-shaped ion acceleration cavity. In some embodiments, the ion acceleration cavity may be in the form of a counterbore, a rectangular slot, a semicircle, a cone, an inverted cone, and a bell shape. As will be appreciated, the shape and configuration of the ion acceleration cavity will affect the ion beam resulting from the ion accelerating unit.

Figure 4A:
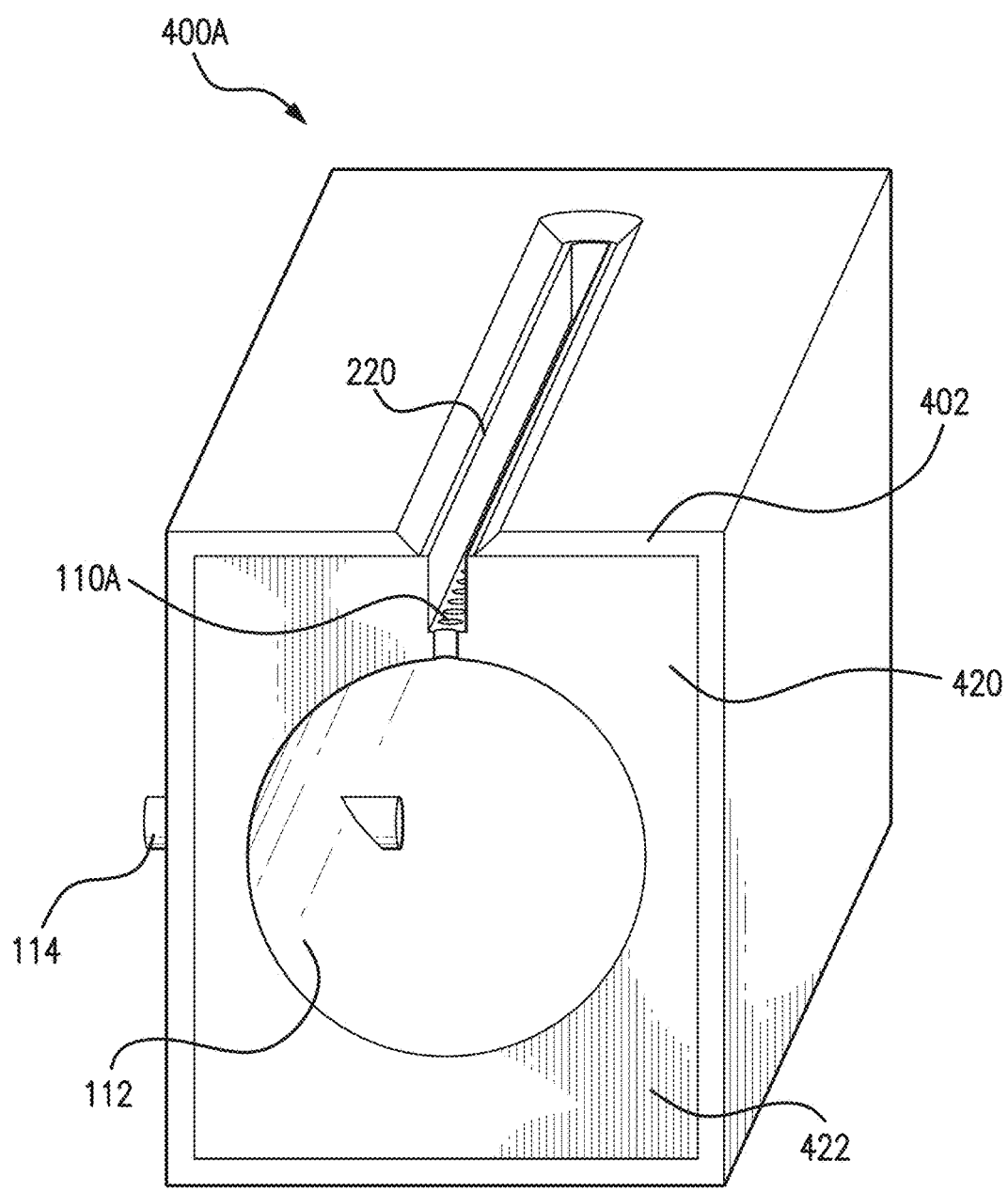
FIG. 4A illustrates an ion accelerating unit having an ion acceleration cavity formed in the hollow cathode body according to exemplary embodiments of the present invention.

FIG. 4A illustrates an ion accelerating unit 400A according to exemplary embodiments of the present invention. Ion accelerating unit 400A may be used as part of an ion source, such as, for example, ion sources 200A, 200B, 200C. Ion accelerating unit 400A includes a hollow cathode body 422, a gas inlet 114, a hollow cathode cavity 112, a plasma exit region 110A, and an ion acceleration cavity 220. Ion accelerating unit 400A further includes an electrically insulating shell 402 covering all exterior electrically conductive parts. In some embodiments, the only conductive surfaces exposed to plasma are the interior of the hollow cathode cavity, the plasma exit orifices, and the ion acceleration cavity. The insulating shell 402 may, in some embodiments, include a cover of non-conductive material, such as ceramic, polymer, or other dielectric materials. The insulating shell 402 may also include a dark space shield. As shown in FIG. 4A, the ion accelerator 420, which forms ion acceleration cavity 220, is part of the hollow cathode body 422.

Figure 4B:
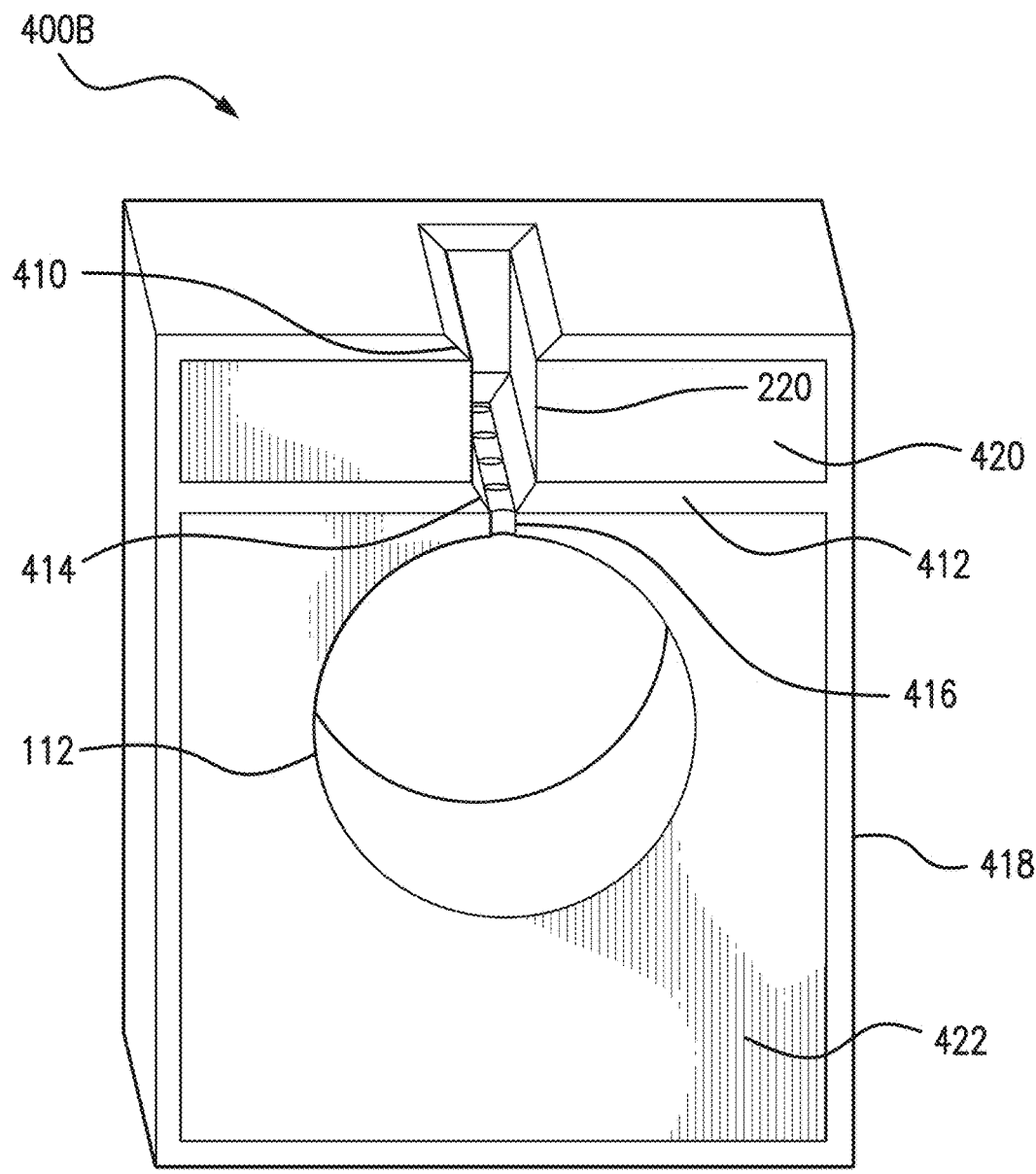
FIG. 4B illustrates an ion accelerating unit having an ion acceleration cavity electrically separated from the hollow cathode body according to exemplary embodiments of the present invention.

FIG. 4B illustrates an ion accelerating unit 400B according to exemplary embodiments of the present invention. Ion accelerating unit 400B may be used as part of an ion source, such as, for example, ion sources 200A, 200B, 200C. In such ion sources, ion accelerating unit 400B may be used in combination with additional ion accelerating units 400B, with ion accelerating unit 400A, or with other ion accelerating units according to embodiments of the present invention. Ion accelerating unit 400B includes a hollow cathode body 422, a gas inlet (not shown), a cavity 112, a plasma exit region 416, and an ion acceleration cavity 220. In the design illustrated in FIG. 4B, the hollow cathode body and the ion acceleration body are separate components. Insulating wall 418 surrounds the hollow cathode body while insulating walls 410, 412 surround the ion acceleration body. Insulating wall 412 is between the ion acceleration body and the hollow cathode body and includes an opening 414 to allow the plasma exit region to be in communication with the ion acceleration cavity. The insulating material 410, 412, 418 may, in some embodiments, include a cover of non-conductive material, such as ceramic, polymer, or other dielectric materials. The insulating material 410, 412, 418 may also include a dark space shield. As shown in FIG. 4B, the ion accelerator 420, which forms ion acceleration cavity 220, is separated from hollow cathode body 422 by insulating shell 412.

As is known in the art, a dark space shield refers to a region around the plasma source having a narrow space (on the order of 5 mm or less) where at low pressure it is physically impossible for plasma to form. As is known in the art, the dark space shield is dependent on gas composition, pressure, and voltage.

Referring now to FIGS. 4A and 4B, in some embodiments of the present invention, the ion acceleration cavity may be an integral part of the hollow cathode body or may be a separate component from the hollow cathode body. For example, in FIG. 4A, the ion acceleration cavity may be cut into the hollow cathode body material as a slot. This will effectively force the ion acceleration body and the hollow cathode body to have the same electrical potential and polarity. As shown in FIG. 4B, the ion acceleration cavity may be electrically insulated from the main hollow cathode body. For example, in FIG. 4B the ion accelerator may be made of a different material than the main hollow cathode body. In this arrangement, according to some embodiments of the present invention, it will be necessary to maintain the electrical polarity relationships between the hollow cathode cavity walls and ion acceleration cavity walls.

In some embodiments, the first and second ion accelerators are configured such that the first and second ion accelerators are biased more positively (or less positively) than the corresponding first and second hollow cathode bodies during the positive portion of the cycle for the respective ion accelerator and hollow cathode body. Specifically when the ion accelerator 420 and the hollow cathode body 422 are electrically insulated (for example, as shown in FIG. 4B), each ion accelerator can be configured to be biased more positively (or less positively) than the corresponding hollow cathode body while that corresponding hollow cathode body is functioning as an anode (i.e., during the positive portion of the cycle). This can be done while still maintaining the necessary electrical polarity relationships between the hollow cathode body and ion accelerator. By managing the relative voltage between the ion accelerator and the hollow cathode body in this way, the resulting acceleration of the ions can be controlled.

Figure 5:
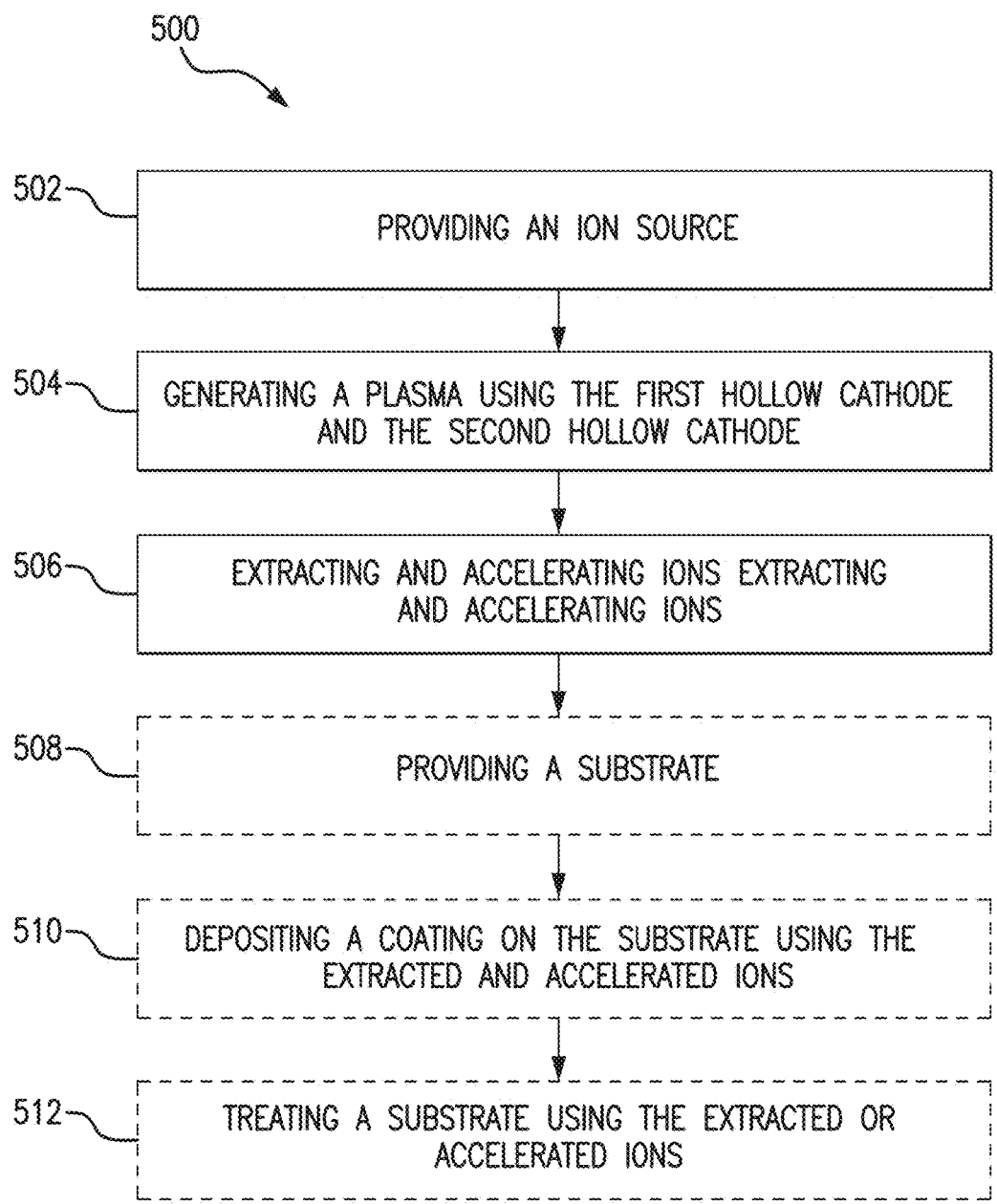
FIG. 5 illustrates a method of extracting and accelerating ions according to exemplary embodiments of the present invention.

FIG. 5 illustrates a method according to exemplary embodiments of the present invention. Method 500 includes providing an ion source, for example ion source 200A (step 502). The ion source 200A includes a chamber 210. In some embodiments, the chamber 210 is a vacuum chamber. The ion source 200A further includes a first ion accelerating unit 202 having a first hollow cathode body 212, a first hollow cathode cavity 112, and a first plasma exit orifice 110A and a second ion accelerating unit 204 having a second hollow cathode body 212, a second hollow cathode cavity 112, and a second plasma exit orifice 110A, the first and second hollow cathode bodies being disposed adjacently in the chamber 210. The ion source 200A further includes a first ion accelerator (such as element 420 in FIG. 4) between and in communication with the first plasma exit orifice 110A and the chamber 210. The first ion accelerator 420 forms a first ion acceleration cavity 220. The ion source 200A further includes a second ion accelerator (such as element 420 in FIG. 4) between and in communication with the second plasma exit orifice 110A and the chamber 210. The second ion accelerator 420 forms a second ion acceleration cavity 220. The first hollow cathode body and the second hollow cathode body alternatively function as electrode and counter-electrode (e.g., alternatively function as cathode and anode) to generate a plasma. Each of the first elongated ion acceleration cavity and the second elongated ion acceleration cavity are sufficient to enable the extraction and acceleration of ions without requiring any additional electrodes, accelerating grids, magnetic fields, neutralizers, or other additional components. Method 500 further includes generating a plasma using the first hollow cathode body and the second hollow cathode body (step 504). Method 500 further includes extracting and accelerating ions (step 506). Optionally, method 500 may include providing a substrate (step 508) and depositing a coating on the substrate using the extracted and accelerated ions (step 510) or treating the substrate using the extracted and accelerated ions (step 512). As will be appreciated, in some embodiments the extracted and accelerated ions are extracted and accelerated away from the ion acceleration cavity. In some embodiments, the extracted and accelerated ions are further extracted and accelerated toward the substrate.

Figure 6:
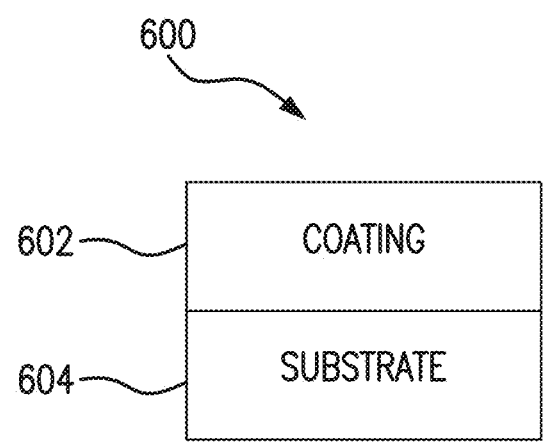
FIG. 6 illustrates a coating-substrate combination according to exemplary embodiments of the present invention.

FIG. 6 illustrates a coating-substrate combination 600, including a coating 602 and a substrate 604. An ion source according to embodiments of the present invention may be used to deposit coating 602 on substrate 604, or alternatively, to treat an already-deposited coating 602. For example, an ion source according to embodiments of the present invention can be used to treat or etch glass substrates, deposit coatings, or densify coatings.

One factor influencing electron current is the temperature of hollow cathode cavity walls. In a hollow cathode setup with cavity wall temperature below about 1000° C., electron emission is dominated by secondary electron emission. Although thermionic emission may be present for temperatures above about 750° C., secondary electron emission still dominates until about 1000*C. As cavity walls are bombarded by ions, the impacting ion kinetic energy along with a negative voltage potential induces electrons to be emitted from wall surfaces. Typically, these "cold" hollow cathodes are run with cavity wall temperatures from about 50° C. to about 500° C. Generally, to maintain hollow cathode structures at these temperatures, cooling methods are applied. Often, water cooling channels are built into the hollow cathode structure. Operating voltage for cold hollow cathode discharges is typically from about 300 volts to about 1000 volts.

Alternatively, hollow cathodes may be run in thermionic mode. For thermionic electron emission to occur, hollow cathode cavity wall temperatures usually range from about 750° C. to about 2000° C. Thermionic hollow cathodes may incorporate heaters around cavity walls to help raise temperature or, more simply, may rely on plasma energy transfer to heat cavity walls. Generally, hot cavities are thermally insulated to reduce conductive or radiative heat loss. Operating voltage for thermionic hollow cathode discharges is typically from about 10 volts to about 300 volts or more commonly from about 10 volts to about 100 volts.

Unlike most conventional ion sources, the ion sources of the disclosed embodiments are compatible with either temperature range or any electron emission mode.

In order to facilitate plasma generation inside of a hollow cathode, a plasma forming gas is introduced within the hollow cathode cavity. This gas becomes ionized through collisions with free, oscillating electrons within the hollow cathode cavity. Typically, in enclosed hollow cathode cavities, a plasma gas is introduced to the cavity space through a gas inlet tube or orifice. Nearly any material in gas phase may be used as the plasma forming gas. Most common gases used as plasma forming gases include He, Ne, Ar, Kr, Xe, $O_2$, $N_2$, and $H_2$. Unlike many ion sources which are limited to inert gasses, generally, the ion sources of the disclosed embodiments will form an ion beam from any ionized gas, including inert or non-inert gasses. Some gas limitations may occur with high temperature hollow cathode cavity materials. For example, hollow cathode cavity wall materials above 1000° C. may chemically react with some ionized gases such as oxygen. If such reactions result in growth of electrically insulating coatings on cavity walls, electron emission can be inhibited. Another consideration for gas or material selection is erosion, or the burning away, of the hollow cathode cavity.

Typical plasma formation gas flows for the point source embodiments disclosed herein may be from about 1 standard cubic centimeter per minute (or sccm) to about 100 sccm. For the linear embodiments disclosed herein, plasma forming gas flows in some embodiments may be from about 0.5 sccm to about 10 sccm per linear mm of cavity length. More typical linear gas flows may be from about 1 sccm to about 5 sccm per mm. These values refer to the total gas flow, summed over each ion accelerating unit in the chamber. As will be appreciated, the total gas flow may be limited by the ability of the vacuum pump used to maintain pressure in the chamber.

In some embodiments of the present invention, plasma exit orifice walls may comprise the same conductive material as the hollow cathode body or cavity walls, such as metal or carbon. The plasma exit orifice walls may also comprise other hard or heat resistant materials such as tungsten carbide. These plasma exit orifices do not necessarily have to be electrically conductive and may comprise a ceramic dielectric material such as a ceramic insert.

The typical diameter of a plasma exit hole or width of a plasma exit slot may be from about 0.5 mm to about 8 mm. Most frequently used sizes are from about 1 mm to about 6 mm. In the case of plasma exit holes, spacing may vary widely from center to center distance of about 1.5 mm to about 50 mm. Spacing between adjacent holes may be uniform or irregular, according to embodiments of the present invention. As a non-limiting example, a uniform ion beam curtain can be established from an exemplary ion source with spacing between plasma exit holes of about 5 mm to about 30 mm.

In embodiments of the present invention, the ion beam formed by at least one of the first ion acceleration cavity and the second ion acceleration cavity may be configured to be a single narrow beam, a single large area beam, an array of single beams, or a continuous linear ion beam curtain. In some embodiments, the ion beam may be at least partially collimated. For example, the design of the ion acceleration cavity will affect the type of ion beam that is created. As will be appreciated, each of the first ion acceleration cavity and the second ion acceleration cavity may form an ion beam, and the ion beam formed by each ion acceleration cavity may be configured to be the same or different as the ion beam formed by the other ion acceleration cavity.

As explained above, when conventional ion sources are used in conjunction with PECVD coating processes, these processes are known for contaminating and coating all nearby vacuum chamber hardware including cathode or anode surfaces. However, in embodiments of the present invention, the hollow cathode cavity walls and ion acceleration cavity walls are protected from this contamination problem. For example, both of these two surfaces are at least partially enclosed and isolated from gases external to the hollow cathode. Both of these two surfaces also tend to be kept clean and electrically conductive by the flow of plasma forming gas flowing across them. That is, the plasma gas tends to sweep away potentially contaminating gases such as precursors used in the PECVD process.

Figure 7:
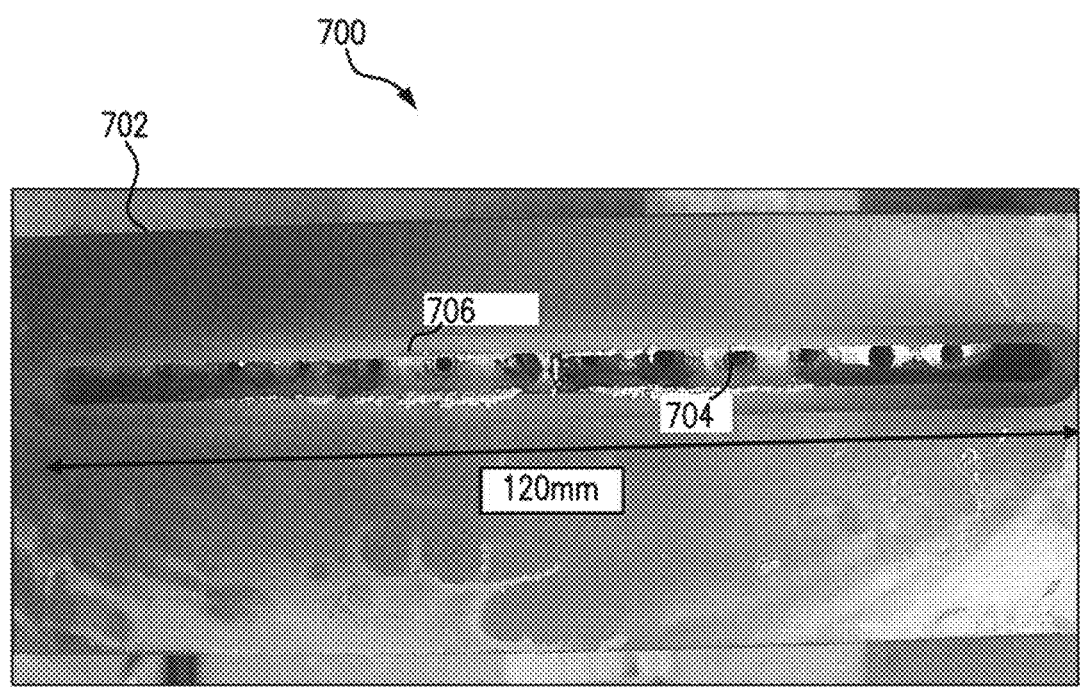
FIG. 7 is a photograph showing an ion source after 24 hours of runtime according to exemplary embodiments of the present invention.

FIG. 7 is a photograph 700 showing an ion source after 24 hours of runtime according to exemplary embodiments of the present invention. Specifically, the ion source includes a hollow cathode 702 having an array of nozzles as a plasma exit region 704 and an ion acceleration cavity 706. The white areas in FIG. 7 are from accumulation of electrically non-conductive titanium dioxide ($TiO_2$) on the walls of the ion acceleration cavity. This contamination can negatively impact the ion source. As shown, the ion source in FIG. 7 comprises an array of nozzles as the plasma exit region. A dark space shield functioning as an insulating shell is present over the face of the hollow cathode.

Figure 8:
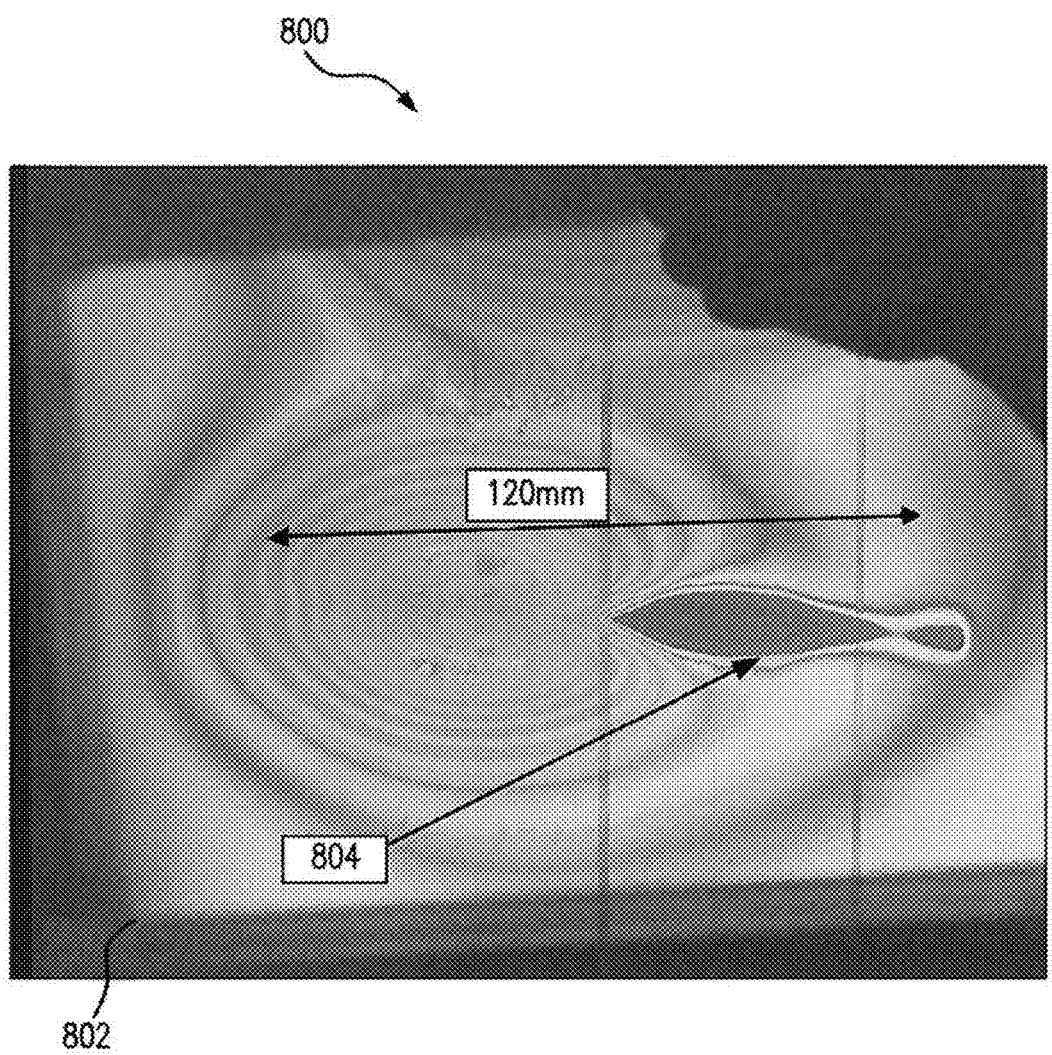
FIG. 8 is a photograph showing an ion etched pattern on a glass substrate according to exemplary embodiments of the present invention.

FIG. 8 is a photograph 800 showing an ion etched pattern on a glass substrate 792 according to exemplary embodiments of the present invention. Color fringes are about 0.3 μm thick titanium oxide coating on the glass substrate. The etched region 804 is approximately 250 μm deep into the glass substrate 802. Plasma and ion beam exposure time on the substrate was approximately 24 hours. During the etching process, no electric charging of the substrate or plasma generation hardware occurred.

Figure 9A:
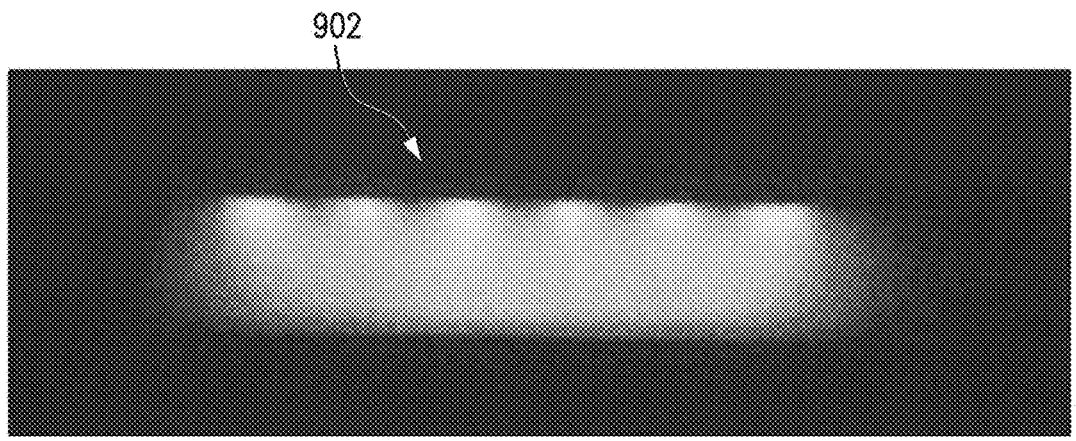
FIG. 9A is a photograph showing plasma being formed by a known hollow cathode plasma source.

FIG. 9A is a photograph showing plasma 902 being formed by a known hollow cathode plasma source. The hollow cathode plasma source comprised six nozzles as a plasma exit region and did not include an ion acceleration cavity. The plasma source shown in FIG. 9A is similar to that depicted by FIG. 1A.

Figure 9B:
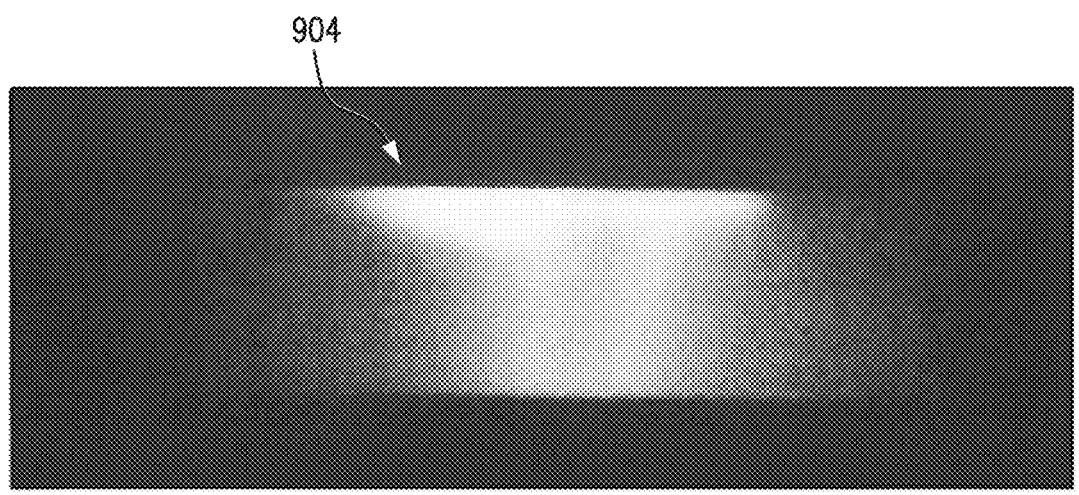
FIG. 9B is a photograph showing plasma being formed by an ion source according to exemplary embodiments of the present invention.

FIG. 9B is a photograph showing plasma 904 being formed by an ion source according to exemplary embodiments of the present invention. The bipolar hollow cathode ion source here included twelve nozzles as a plasma exit region and an ion acceleration cavity 10 mm deep and 4.8 mm wide. As can be seen, the lighter streaks in the plasma are indicative of a beam of ions being accelerated from the source down to the substrate.

Many other combinations of hollow cathodes and multiphase power inputs are possible with the specific arrangements being designed to suit a particular application, as one of ordinary skill in the art will appreciate from the present disclosure.

While various embodiments have been described above, it should be understood that they have been presented by way of example only, and not limitation. Thus, the breadth and scope of the present disclosure should not limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A method of extracting and accelerating ions comprising:
(i) providing a ion source comprising:
a chamber;
a first hollow cathode having a first hollow cathode cavity and a first plasma exit orifice and a second hollow cathode having a second hollow cathode cavity and a second plasma exit orifice, the first and second hollow cathodes being disposed adjacently in the chamber;
a first ion accelerator between and in communication with the first plasma exit orifice and the chamber, wherein the first ion accelerator forms a first ion acceleration cavity; and
a second ion accelerator between and in communication with the second plasma orifice and the chamber, wherein the second ion accelerator forms a second ion acceleration cavity;
wherein a width of the first ion acceleration cavity is larger than a width of the first plasma exit orifice, and a width of the second ion acceleration cavity is larger than a width of the second plasma exit orifice;
(ii) generating a plasma within the first hollow cathode and the second hollow cathode, wherein the first hollow cathode and the second hollow cathode are configured to alternatively function as electrode and counter-electrode; and
(iii) extracting and accelerating ions from the first hollow cathode and the second hollow cathode through the first ion acceleration cavity and the second ion acceleration cavity;
wherein each of the first ion acceleration cavity and the second ion acceleration cavity are sufficient to enable the extraction and acceleration of ions without the presence of magnetic fields.

2. The method of claim 1, wherein the extracted and accelerated ions from at least one of the first ion acceleration cavity and the second ion acceleration cavity form one of: a single narrow beam, a single large-area beam, an array of single beams, and a continuous linear beam curtain.

3. The method of claim 1, wherein the extracted and accelerated ions from at least one of the first ion acceleration cavity and the second ion acceleration cavity form a collimated ion beam.

4. The method of claim 1, wherein the first hollow cathode and the first ion accelerator are at a first same electric potential difference and the second hollow cathode and the second ion accelerator are at a second same electric potential difference.

5. The method of claim 1, wherein the first hollow cathode and the first ion accelerator are at a first same polarity relative to an electric potential of the plasma and the second hollow cathode and the second ion accelerator are at a second same polarity relative to the electric potential of the plasma.

6. The method of claim 1, wherein the first ion accelerator comprises a portion of the first hollow cathode and/or the second ion accelerator comprises a portion of the second hollow cathode.

7. The method of claim 1, wherein the first ion acceleration cavity comprises a slot in the first ion accelerator and/or the second ion acceleration cavity comprises a slot in the second ion accelerator.

8. The method of claim 1, wherein the first ion accelerator and the first hollow cathode are electrically insulated from each other and/or the second ion accelerator and the second hollow cathode are electrically insulated from each other.

9. The method of claim 1, wherein at least one of the electric potential of the first ion accelerator and the electric potential of the second ion accelerator is switching at a frequency between negative and positive with respect to the electric potential of the plasma.

10. The method of claim 1, wherein the first ion accelerator is electrically connected to an exterior of the first hollow cathode and/or the second ion accelerator is electrically connected to an exterior of the second hollow cathode.

11. The method of claim 1, wherein the first ion accelerator is electrically connected to an interior of the first hollow cathode and/or the second ion accelerator is electrically connected to an interior of the second hollow cathode.

12. The method of claim 1, wherein at least one of the first ion acceleration cavity and the second ion acceleration cavity is in the form of one of a counterbore, a rectangular slot, a semicircle, a cone, an inverted cone, and a bell shape.

13. The method of claim 1, wherein interior surfaces of at least one of the first ion accelerator and the second ion accelerator are electron-emitting and electron-accepting.

14. The method of claim 1, wherein external surfaces of at least one of the first hollow cathode, the first ion accelerator, the second hollow cathode, and the second ion accelerator are electrically insulated.

15. The method of claim 14, wherein said external surfaces are electrically insulated by at least one of a polymer and a non-conductive ceramic.

16. The method of claim 14, wherein said external surfaces are electrically insulated by a dark space shield.

17. The method of claim 1, wherein the chamber comprises a vacuum chamber.

18. The method of claim 1, wherein the first plasma exit orifice restricts gas flow between the first hollow cathode and the chamber and/or the second plasma exit orifice restricts gas flow between the second hollow cathode and the chamber.

19. The method of claim 1, wherein at least one of the first ion acceleration cavity and the second ion acceleration cavity comprises an elongated cavity.

20. The method of claim 1, wherein at least one of the first plasma exit orifice and the second plasma exit orifice comprises a plasma exit nozzle.

21. The method of claim 1, wherein at least one of the first plasma exit orifice and the second plasma exit orifice comprises a plurality of plasma exit nozzles.

22. The method of claim 1, wherein at least one of the first plasma exit orifice and the second plasma exit orifice comprises a linear slot.

23. The method of claim 1, wherein the first ion acceleration cavity partially encloses gas emerging from the first plasma exit orifice and/or the second ion acceleration cavity partially encloses gas emerging from the second plasma exit orifice.

24. The method of claim 1, wherein an average energy of the extracted and accelerated ions is less than 100 eV.

25. The method of claim 1, wherein an average energy of the extracted and accelerated ions is greater than 100 eV.

26. The method of claim 1, wherein the ion source further includes a source of power configured to power at least one of the first hollow cathode, the first ion accelerator, the second hollow cathode, and the second ion accelerator.

27. The method of claim 26, wherein the source of power operates at a root-mean-square AC voltage between 200V and 1000V.

28. The method of claim 26, wherein the source of power operates at a root-mean-square AC voltage between 20V and 200V.

29. The method of claim 1, wherein the first and second hollow cathodes are configured such that, the hollow cathode serving as positive electrode is more positively biased than walls of the chamber.

30. The method of claim 1, wherein the first and second ion accelerators are configured such that the first and second ion accelerators are biased more positively than the corresponding first and second hollow cathodes during the positive portion of the cycle for the respective ion accelerator and hollow cathode.

31. The method of claim 1, wherein the first and second ion accelerators are configured such that the first and second ion accelerators are biased less positively than the corresponding first and second hollow cathodes.

32. The method of claim 1, wherein the only electrically active surfaces consist essentially of an inner wall of each of the first and second hollow cathodes and an inner wall of each of the first and second ion accelerators.

33. The method of claim 1, wherein the frequency that the first hollow cathode and the second hollow cathode alternate between electrode and counter-electrode is from 1 kHz to 1 MHz.

34. The method of claim 1, wherein at least one of the first ion acceleration cavity and the second ion acceleration cavity is angled to distribute ion bombardment to a common line.

35. The method of claim 1, wherein the plasma is self-neutralizing.

36. The method of claim 1, wherein the ion source is absent of any Hall current.

37. The method of claim 1, wherein the ion source is absent of any accelerating grids.

38. The method of claim 1, wherein the ion source is from about 0.1 m to about 4 m long and has uniform plasma and ion emission over the length of the ion source.

39. The method of claim 1, further comprising introducing plasma-forming gas into at least one of the first hollow cathode cavity and the second hollow cathode cavity, wherein for each hollow cathode where a plasma-forming gas is introduced, a pressure gradient is formed between the hollow cathode cavity, the plasma exit region, the ion acceleration cavity, and the chamber, in order of decreasing pressure gradient.

40. The method of claim 1, further comprising depositing a coating using the extracted and accelerated ions.

41. The method of claim 40, further comprising densifying the deposited coating.

42. The method of claim 1, further comprising treating a substrate using the extracted or accelerated ions.

43. The method of claim 42, wherein treating the substrate comprises at least one of: heating, cleaning, surface etching, and chemically modifying a surface.

44. The method of claim 1, wherein each of the first ion acceleration cavity and the second ion acceleration cavity are sufficient to enable the extraction and acceleration of ions without the presence of additional electrodes.

* * * * *